US012677387B2

(12) United States Patent
Oh et al.

(10) Patent No.: US 12,677,387 B2
(45) Date of Patent: Jul. 7, 2026

(54) DISPLAY DEVICE

(71) Applicant: SAMSUNG ELECTRONICS CO., LTD., Suwon-si (KR)

(72) Inventors: Pilyong Oh, Suwon-si (KR); Seungjae Kim, Suwon-si (KR); Kwangjae Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/630,743

(22) Filed: Apr. 9, 2024

(65) Prior Publication Data

US 2024/0260213 A1 Aug. 1, 2024

Related U.S. Application Data

(63) Continuation of application No. PCT/KR2022/017547, filed on Nov. 9, 2022.

(30) Foreign Application Priority Data

Jan. 3, 2022 (KR) ........................ 10-2022-0000313

(51) Int. Cl.
*H05K 5/02* (2006.01)
(52) U.S. Cl.
CPC .................................. *H05K 5/0217* (2013.01)
(58) Field of Classification Search
CPC ........ H05K 5/0217; G06F 1/1605; G06F 1/16
See application file for complete search history.

(56) References Cited

U.S. PATENT DOCUMENTS

| 9,445,039 B2 | 9/2016 | Suzuki et al. |
| 10,356,500 B2 | 7/2019 | Kim |
| 10,383,237 B2 | 8/2019 | Park et al. |
| (Continued) | | |

FOREIGN PATENT DOCUMENTS

| CN | 209823889 U | 12/2019 |
| JP | 6-326949 A | 11/1994 |
| (Continued) | | |

OTHER PUBLICATIONS

Machine translation of KR 20060112072A (Year: 2025).*

(Continued)

*Primary Examiner* — Sagar Shrestha
(74) *Attorney, Agent, or Firm* — Sughrue Mion, PLLC

(57) ABSTRACT

A display apparatus includes: a display panel; a rear cover covering a rear of the display panel; a front chassis including: a side exterior part covering a side of the display panel and including a chassis emitting hole, and a rear flange extending from the side exterior part and forming an accommodation space between the display panel and the side exterior part, the rear flange facing and being coupled to the rear cover; a speaker module including a module emitting hole configured to emit sound to a side edge of the speaker module, wherein at least a portion of the speaker module is in the accommodation space such that the module emitting hole is adjacent to and faces the chassis emitting hole; and a module mount configured to be coupled to the front chassis and the speaker module to prevent the speaker module from being separated from the accommodation space.

17 Claims, 21 Drawing Sheets

(56)                References Cited

U.S. PATENT DOCUMENTS

| | | | |
|---|---|---|---|
| 10,834,495 | B2 * | 11/2020 | Lee .......................... H04R 1/02 |
| 11,237,602 | B2 | 2/2022 | Yoon et al. |
| 11,314,476 | B2 | 4/2022 | Park et al. |
| 11,451,902 | B1 * | 9/2022 | Leonhardt ............ H04R 1/2888 |
| 11,457,298 | B2 | 9/2022 | Sakata et al. |
| 11,632,630 | B2 | 4/2023 | Lee et al. |
| 11,765,491 | B2 | 9/2023 | Tanaka |
| 2003/0223609 | A1 | 12/2003 | Anderson et al. |
| 2013/0070956 | A1 | 3/2013 | Yamanaka |
| 2013/0221812 | A1 * | 8/2013 | Hashimoto .............. H04N 5/64 |
| | | | 312/7.2 |
| 2018/0206354 | A1 * | 7/2018 | Yoon ..................... G06F 1/1656 |
| 2019/0037293 | A1 * | 1/2019 | Kim ..................... H04M 1/026 |
| 2021/0006876 | A1 * | 1/2021 | Moon ................... G06F 1/1688 |
| 2021/0034119 | A1 * | 2/2021 | Yoon ........................ H04R 1/06 |
| 2021/0208448 | A1 * | 7/2021 | Kim ....................... H04R 1/023 |
| 2021/0337055 | A1 * | 10/2021 | Lee ........................ H04R 1/025 |
| 2022/0066516 | A1 * | 3/2022 | Cho ..................... G06F 1/1683 |
| 2022/0174396 | A1 | 6/2022 | Kim et al. |
| 2022/0286545 | A1 * | 9/2022 | Koch ................... G06F 1/1637 |

FOREIGN PATENT DOCUMENTS

| | | | |
|---|---|---|---|
| JP | 6-49035 | Y2 | 12/1994 |
| JP | 2006-30312 | A | 2/2006 |
| JP | 2011-182050 | A | 9/2011 |
| JP | 2013-70160 | A | 4/2013 |
| JP | 2015-144479 | A | 8/2015 |
| JP | 2016-21738 | A | 2/2016 |
| JP | 2022-119087 | A | 8/2022 |
| KR | 10-1998-0077264 | A | 11/1998 |
| KR | 20-1999-0023677 | U | 7/1999 |
| KR | 10-0274783 | B1 | 12/2000 |
| KR | 10-2001-0035731 | A | 5/2001 |
| KR | 10-0350246 | B1 | 8/2002 | |
| KR | 10-2006-0112072 | A | 10/2006 | |
| KR | 20060112072 | A | * 10/2006 | ............ H04N 5/655 |
| KR | 10-2007-0078023 | A | 7/2007 | |
| KR | 10-2009-0039372 | A | 4/2009 | |
| KR | 10-0956096 | B1 | 5/2010 | |
| KR | 10-2013-0116581 | A | 10/2013 | |
| KR | 10-1359836 | B1 | 2/2014 | |
| KR | 10-2014-0141400 | A | 12/2014 | |
| KR | 10-2016-0129235 | A | 11/2016 | |
| KR | 10-2019-0012004 | A | 2/2019 | |
| KR | 10-2019-0080410 | A | 7/2019 | |
| KR | 10-2021-0015149 | A | 2/2021 | |
| KR | 10-2021-0020764 | A | 2/2021 | |
| KR | 10-2021-0086133 | A | 7/2021 | |
| KR | 10-2021-0110573 | A | 9/2021 | |
| KR | 10-2315588 | B1 | 10/2021 | |
| KR | 10-2021-0136708 | A | 11/2021 | |
| KR | 10-2022-0069606 | A | 5/2022 | |

OTHER PUBLICATIONS

Machine translation of KR 101359836B1 (Year: 2025).*

Communication issued Jan. 8, 2025 by the European Patent Office in European Patent Application No. 22916403.3.

International Search Report (PCT/ISA/210) issued on Jan. 31, 2023 by the International Searching Authority in International Patent Application No. PCT/KR2022/017547.

Written Opinion (PCT/ISA/237) issued on Jan. 31, 2023 by the International Searching Authority in International Patent Application No. PCT/KR2022/017547.

Communication issued May 14, 2026 by the Korean Ministry of Intellectual Property in Korean Patent Application No. 10-2022-0000313.

* cited by examiner

DISPLAY DEVICE

CROSS REFERENCE TO RELATED APPLICATION(S)

This application is a continuation of International Application No. PCT/KR2022/017547, filed on Nov. 9, 2022, in the Korean Intellectual Property Receiving Office, which is based on and claims priority to Korean Patent Application No. 10-2022-0000313, filed on Jan. 3, 2022, in the Korean Intellectual Property Office, the disclosures of which are incorporated by reference herein in their entireties.

BACKGROUND

1. Field

The disclosure relates to a display apparatus including a speaker module coupled to a front chassis through a module mount.

2. Description of Related Art

A display apparatus is a type of output device that visually displays data information, such as letters and figures, and images.

In general, a display apparatus may receive content data including audio data from various content sources and output audio corresponding to the audio data. In order to output the audio, the display apparatus may include a speaker module.

In order for the speaker module of the display apparatus to provide a three-dimensional sound, a plurality of the speaker modules may be disposed at edges of the display apparatus to attempt to provide sounds in various directions.

A front chassis with a vent hole may be located at the edge of the display apparatus. In order for the speaker module to provide a better acoustic environment, an area where a sound is emitted from the speaker module may be located close to the vent hole of the front chassis.

SUMMARY

Provided is a display apparatus which may prevent a speaker module from being separated when accommodated in an accommodation space of a front chassis in order for the speaker module to be located close to a vent hole of the front chassis.

Further, provided is a display apparatus which may allow a speaker module to be inserted into an accommodation space of a front chassis even without separate avoiding processing on the front chassis.

Further, provided is a display apparatus in which shaking of a speaker module may be restricted when the speaker module is accommodated in an accommodation space of a front chassis.

Additional aspects will be set forth in part in the description which follows and, in part, will be apparent from the description, or may be learned by practice of the presented embodiments.

According to an aspect of the disclosure, a display apparatus includes: a display panel; a rear cover covering a rear of the display panel; a front chassis including: a side exterior part covering a side of the display panel and including a chassis emitting hole, and a rear flange extending from the side exterior part and forming an accommodation space between the display panel and the side exterior part, the rear flange facing and being coupled to the rear cover; a speaker module including a module emitting hole configured to emit sound to a side edge of the speaker module, wherein at least a portion of the speaker module is in the accommodation space such that the module emitting hole is adjacent to and faces the chassis emitting hole; and a module mount configured to be coupled to the front chassis and the speaker module to prevent the speaker module from being separated from the accommodation space.

The speaker module may be configured to be inserted into the accommodation space by sliding along an extension direction of the rear flange.

The front chassis may further include a mount coupling part configured to be slidably coupled to the module mount.

The mount coupling part may include a sliding groove extending from an end of the rear flange toward the side exterior part in which the module mount is slidably inserted.

The module mount may include an elastic member, and the module mount may be coupled to the sliding groove with a forced fitting.

The module mount may include a deformable groove at a central portion of the module mount so that the module mount is deformable when inserted into the sliding groove.

The module mount may include a head portion to be supported on an outer surface of the rear flange when the module mount is inserted into the sliding groove.

The module mount may further include a separation prevention portion configured to support an inner surface of the rear flange within the accommodation space to prevent the module mount from being separated from the sliding groove when the module mount is inserted into the sliding groove.

The speaker module may further include an insertion groove forming portion forming an insertion groove to which the module mount is configured to be coupled, the separation prevention portion may extend to one side of the insertion groove forming portion, and the module mount may further include an insertion groove support portion configured to support another side of the insertion groove forming portion to prevent the module mount from being separated from the insertion groove.

The module mount may be formed integrally with the speaker module.

The display apparatus may further include: a frame coupled to the display panel at the rear of the display panel; and a fixer configured to couple the speaker module to the frame to prevent forward and backward movements of the speaker module.

The fixer may include: a support part configured to support the speaker module on one side of the fixer; and a coupling part coupled to the frame on another side of the fixer.

The frame may include a guide groove adjacent to the coupling part, and the coupling part of the fixer may include a guide protrusion accommodated in the guide groove at a position corresponding to the guide groove and configured to guide the fixer to be coupled to the frame.

The support part may include a front support portion configured to support a front surface of the speaker module and a rear support portion configured to support a rear surface of the speaker module.

The speaker module and the fixer may be provided at a rear of the frame, the rear cover may be provided at a rear of the speaker module and the fixer, and the fixer may further include a cover coupling portion configured to be coupled to the rear cover.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
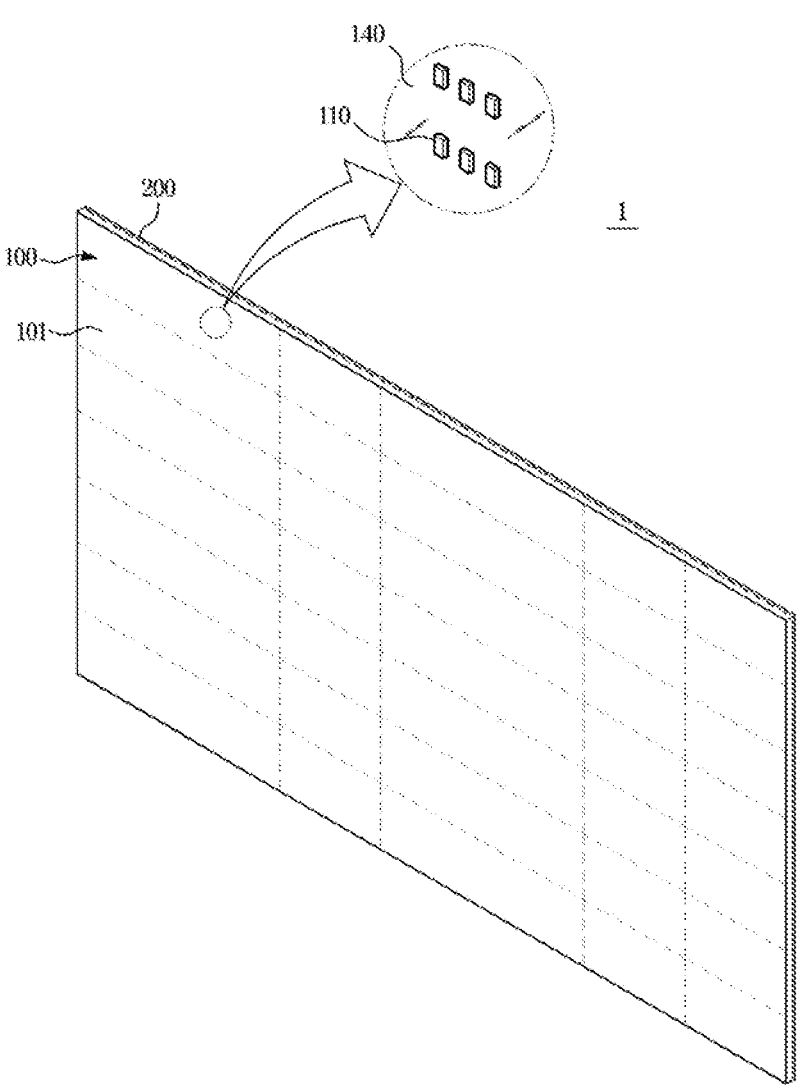
FIG. 1 is a perspective view of a display apparatus according to an embodiment of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

The terms used herein are for the purpose of describing the embodiments and are not intended to restrict and/or to limit the present disclosure.

The singular expressions herein may include plural expressions, unless the context clearly dictates otherwise.

The terms "comprises," "includes," and "has" are intended to indicate that there are features, numbers, steps, operations, components, parts, or combinations thereof described in the specification, and do not exclude the presence or addition of one or more other features, numbers, steps, operations, components, parts, or combinations thereof.

It will be understood that, although the terms "first," "second," etc. may be used herein to describe various components, these components should not be limited by these terms, and the terms are only used to distinguish one component from another. For example, without departing from the scope of the present disclosure, a first component may be referred to as a second component, and similarly, the second component may also be referred to as a first component.

The term "and/or" includes any combination of a plurality of related items or any one of a plurality of related items.

In this specification, the meaning of 'identical' includes properties that are similar to each other or are similar within a certain range. Also, 'identical' means 'substantially identical'. The meaning of 'substantially identical' should be understood as falling within the scope of 'the same' as values falling within the margin of error in manufacturing or values falling within a range that has no meaning compared to the standard value.

In this specification, the terms "up-down direction," "lower portion," "front-rear direction," etc. used in the following description are defined with reference to the drawings, and the shape and position of each component are not limited by these terms.

As illustrated in FIG. 1, a direction in which a display panel 100 faces is referred to as the front, and based on this, the rear, left and right sides, and upper and lower sides are defined.

Hereinafter, embodiments of the present disclosure will be described in detail with reference to the accompanying drawings.

FIG. 1 is a perspective view of a display apparatus 1 according to an embodiment of the present disclosure.

The display apparatus 1 is an apparatus that displays information, materials, data, etc. in the form of text, shapes, graphs, images, etc., and a TV, PC, mobile, digital signage, etc. may be implemented as the display apparatus 1.

As illustrated in FIG. 1, the display panel 100 may be positioned in front of the display apparatus 1. The display panel 100 is a part in which images are displayed.

A front chassis 200 extending along an edge of the display panel 100 may be provided. Through this, the front chassis 200 may protect a side of the display panel 100.

The display panel 100 and the front chassis 200 may form a front exterior of the display apparatus 1.

The display apparatus 1 may include a power supply device provided to supply power to the display panel 100 and a main board provided to control the overall operation of the display panel 100.

The display apparatus 1 may include a driving board provided to drive the display panel 100 or a display module 101 and a T-CON board (timing control board) configured to generate timing signals necessary for controlling the display panel 100 or the display module 101.

The display panel 100 may be provided such that a plurality of display modules 101 is mounted thereon for convenience of manufacturing. FIG. 1 illustrates that the forty-nine display modules 101 are arranged in the form of a 7*7 matrix, but this is only an example, and there is no limit to the number and arrangement method of the display modules 101.

The display module 101 may have a quadrangle shape. That is, the display module 101 may have a rectangular or square shape.

Therefore, the display module 101 may include edges formed in the up, down, left and right directions with respect to the front.

The display panel 100 or the display module 101 may include self-light emitting elements or received-light emitting elements.

The self-light emitting element may visually output images by emitting light on its own without a separate light source. For example, an organic light emitting diode (OLED), a quantum dot-organic light emitting diode (QD-OLED), an inorganic light emitting element (or micro LED) 110 composed of an inorganic light emitting material, etc. may be elements capable of emitting light on its own based on a supplied current.

The received-light emitting element may include an element requiring a separate light source. For example, a liquid crystal display (LCD), which is a received-light emitting element, changes the arrangement of liquid crystals through electric current, but a separate light source is required to visually output images through the changed arrangement of liquid crystals.

The display apparatus 1 of the present disclosure may be applied to both the display panel 100 having a self-light emitting element and the display panel 100 having a received-light emitting element. However, for convenience of explanation, a self-light emitting element, particularly the display panel 100 including the inorganic light emitting elements 110, will be described below.

As illustrated in FIG. 1, the inorganic light emitting elements 110 may be mounted on a substrate 140. Hereinafter, the display apparatus according to an embodiment of the present disclosure will be described in more detail with reference to FIG. 2.

Figure 2:
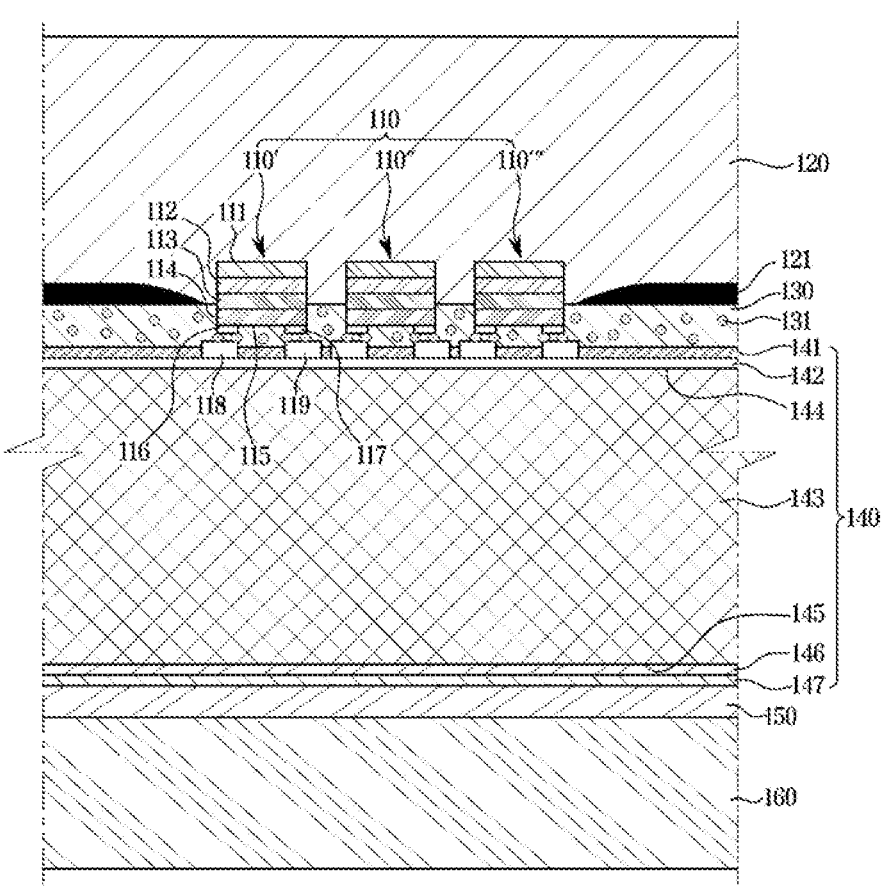
FIG. 2 is an enlarged cross-sectional view of some components of a display module of the display apparatus of FIG. 1 according to an embodiment of the disclosure.

FIG. 2 is an enlarged cross-sectional view of some components of the display module 101 of the display apparatus 1 of FIG. 1.

Some components of the display apparatus 1, including a plurality of the inorganic light emitting elements 110 illustrated in the drawing, are micro-scale components with a size of several μm to hundreds of μm, and for convenience of explanation, some components (inorganic light emitting element 110, black matrix 121, etc.) are shown on an exaggerated scale.

As illustrated in FIG. 2, the display module 101 may include the substrate 140 and the inorganic light emitting elements 110 mounted on the substrate 140. The inorganic light emitting element 110 may be mounted on a mounting surface 144 of the substrate 140, which directs to the front. FIG. 2 illustrates that a thickness of the substrate 140 in a front-rear direction is exaggeratedly thick for convenience of explanation.

The substrate 140 may have a quadrangle shape. As described above, the display module 101 may have a quadrangle shape, and the substrate 140 may have a quadrangle shape to correspond thereto.

The substrate 140 may have a rectangular or square shape.

The substrate 140 may include four edges corresponding to the edges of the display module 101 formed in the up, down, left, and right directions with respect to the front.

The substrate 140 may include a base substrate 143, the mounting surface 144 forming one surface of the base substrate 143, a rear surface 145 forming the other surface of the base substrate 143 and disposed on a side opposite to the mounting surface 144, and side surfaces disposed between the mounting surface 144 and the rear surface 145.

The substrate 140 may include a thin film transistor (TFT) layer 142 formed on the base substrate 143 to drive the inorganic light emitting elements 110. The base substrate 143 may include a glass substrate 140. That is, the substrate 140 may include the substrate 140 of a chip on glass (COG) type. The substrate 140 may be formed with a first pad electrode 118 provided to electrically connect the inorganic light emitting elements 110 to the TFT layer 142.

A thin film transistor (TFT) constituting the TFT layer 142 is not limited to a specific structure or type and may be configured with various embodiments. That is, the TFT of the TFT layer 142 according to an embodiment of the present disclosure may be implemented not only with a low temperature poly silicon (LTPS) TFT, an oxide TFT, and a Si (poly silicon or a-silicon) TFT, but also with an organic TFT and a graphene TFT.

In addition, the TFT layer 142 may be replaced with a complementary metal-oxide semiconductor (CMOS) type, n-type MOSFET, or p-type MOSFET transistor when the base substrate 143 of the substrate 140 is provided as a silicon wafer.

The inorganic light emitting elements 110 are formed of an inorganic material, and may include the inorganic light emitting element 110 having a size of several μm to tens of μm in width, length, and height, respectively. The micro-inorganic light emitting element 110 may have a cross-sectional length of 100 μm or less among the width, length, and height. That is, the inorganic light emitting element 110 may be picked up from a wafer made of sapphire or silicon and directly transferred onto the substrate 140. The inorganic light emitting elements 110 may be picked up and transferred through an electrostatic method using an electrostatic head or a stamping method using an elastic polymer material such as PDMS or silicon as a head.

The inorganic light emitting elements 110 may be a light emitting structure including an n-type semiconductor 112, an active layer 113, a p-type semiconductor 114, a first contact electrode 116, and a second contact electrode 117.

One of the first contact electrode 116 and the second contact electrode 117 may be electrically connected to the n-type semiconductor 112, and the other one of the first contact electrode 116 and the second contact electrode 117 may be electrically connected to the p-type semiconductor 114.

The first contact electrode 116 and the second contact electrode 117 may be in the form of a flip chip arranged horizontally and arranged toward the same direction (a direction opposite to a direction of light emission).

The inorganic light emitting element 110 has a light emitting surface 111 disposed toward the front when mounted on the mounting surface 144, a side surface, and a bottom surface 115 disposed on the opposite side of the light emitting surface 111, and the first contact electrode 116 and the second contact electrode 117 may be formed on the bottom surface 115.

That is, the contact electrodes of the inorganic light emitting element 110 are disposed on the opposite side of the light emitting surface 111, and accordingly may be disposed on the opposite side of a direction in which light is radiated.

The contact electrodes are disposed to face the mounting surface 144 to be electrically connected to the TFT layer 142, and the light emitting surface 111 radiating light in a direction opposite to a direction in which the contact electrodes are disposed may be disposed.

Therefore, when light generated from the active layer 113 is radiated toward the front through the light emitting surface 111, the light may be radiated toward the front without interference from the first contact electrode 116 or the second contact electrode 117.

That is, the front may be defined as the direction in which the light emitting surface 111 is disposed to radiate light.

The first contact electrode 116 and the second contact electrode 117 may be electrically connected to the first pad electrode 118 and a second pad electrode 119 formed on the mounting surface 144 side of the substrate 140, respectively.

The inorganic light emitting element 110 may be directly connected to the pad electrodes through an anisotropic conductive layer 130 or a configuration such as solder.

The anisotropic conductive layer 130 may be formed on the substrate 140 to mediate electrical connection between the contact electrodes and the pad electrodes. The anisotropic conductive layer 130 is formed by attaching an anisotropic conductive adhesive onto a protective film, and may have a structure in which conductive balls 131 are dispersed in adhesive resin. The conductive ball 131 is a conductive sphere surrounded by a thin insulating film, and may electrically connect one conductor to another as the insulating film is broken by pressure.

The anisotropic conductive layer 130 may include an anisotropic conductive film (ACF) in the form of a film and an anisotropic conductive paste (ACP) in the form of a paste.

Therefore, when pressure is applied to the anisotropic conductive layer 130 when the inorganic light emitting elements 110 are mounted on the substrate 140, the insulating films of the conductive balls 131 may be broken so that the contact electrodes of the inorganic light emitting elements 110 and the pad electrodes of the substrate 140 may be electrically connected.

However, the plurality of inorganic light emitting elements 110 may be mounted on the substrate 140 through solder instead of the anisotropic conductive layer 130. After the inorganic light emitting elements 110 are aligned on the substrate 140, the inorganic light emitting elements 110 may be adhered to the substrate 140 through a reflow process.

The inorganic light emitting elements 110 may include a red light emitting element 110', a green light emitting element 110'', and a blue light emitting element 110''', and may be mounted on the mounting surface 144 of the substrate 140 with forming a series of the red light emitting element 110', green light emitting element 110'', and blue light emitting element 110''' as one unit. A series of the red light emitting element 110', green light emitting element 110'', and blue light emitting element 110''' may form one pixel. In this case, the red light emitting element 110', green light emitting element 110'', and blue light emitting element 110''' may each form a subpixel.

The red light emitting element 110', the green light emitting element 110'', and the blue light emitting element 110''' may be arranged in a row at a predetermined interval as in the embodiment of the present disclosure, or may be arranged in other forms such as a triangular shape.

The substrate 140 may include a light absorbing layer 141 to improve contrast by absorbing external light. The light absorbing layer 141 may be formed on the entire mounting surface 144 of the substrate 140. The light absorbing layer 141 may be formed between the TFT layer 142 and the anisotropic conductive layer 130.

The display module 101 may further include black matrices 121 formed between the inorganic light emitting elements 50.

The black matrix 121 may perform a function of supplementing the light absorbing layer 141 formed entirely on the mounting surface 144 side of the substrate 140. That is, the black matrix 121 may absorb external light to make the substrate 140 appear black, thereby improving screen contrast.

The black matrix 121 may have a black color.

In an embodiment, the black matrix 121 may be disposed between the pixels formed by a series of the red light emitting element 110', green light emitting element 110'', and blue light emitting element 110'''. However, the black matrix may be formed in more detail to partition each of the light emitting elements 110, which are the subpixels.

The black matrix 121 may have a grid shape with horizontal and vertical patterns disposed between the pixels.

The black matrix 121 may be formed by applying light-absorbing ink on the anisotropic conductive layer 130 through an ink-jet process and then curing the applied light-absorbing ink, or may be formed by coating the anisotropic conductive layer 130 with a light-absorbing film.

That is, the black matrices 121 may be formed between the inorganic light emitting elements 110, which the inorganic light emitting elements 110 are not mounted, in the anisotropic conductive layer 130 formed entirely on the mounting surface 144.

The display module 101 may include a front cover 120 disposed toward the front on the mounting surface 144 to cover the mounting surface 144.

The front cover 120 may include a film.

The film of the front cover 120 may be a functional film with optical performance.

An adhesive layer of the front cover 120 may have a height greater than or equal to a predetermined height toward the front where the mounting surface 144 or the light emitting surface 111 faces. This is to sufficiently fill gaps that may be formed between the front covers 120 and the inorganic light emitting elements 110 when the front covers 120 are disposed on the substrate 140.

Each of the display modules 101 may include a heat dissipation member 160 provided on the rear surface of the substrate 140 to dissipate heat generated by the substrate 140.

The heat generated from the substrate 140 may include heat generated from various components. Heat that accounts for the largest proportion of the heat generated from the substrate 140 and transferred to the rear surface is heat generated when the plurality of inorganic light emitting elements 110 emits light. In addition, heat may be generated from a plurality of components disposed on the mounting surface 144 of the substrate 140, such as the TFT layer 142, and the heat generated from the plurality of components may be introduced into the substrate 140.

In addition, heat may be transferred to the substrate 140 from the outside of the substrate 140, and heat may be transferred to the substrate 140 through components other than the substrate 140, thereby generating heat in the substrate 140.

The heat generated from the substrate 140 to be described below refers to heat substantially generated from a plurality of components, which is disposed on the substrate 140 including the inorganic light emitting elements 110, and then introduced into the substrate 140.

As described above, most of the heat generated from the plurality of inorganic light emitting elements 110 is introduced into the substrate 140, and the largest proportion of the heat generated from the substrate 140 is the heat generated from the inorganic light emitting elements 110. However, as described above, it may be expressed that heat is generated in the substrate 140 by heat generated from various components and the outside of the substrate 140 in addition to the inorganic light emitting elements 110. In addition, each of the display modules 101 may include an adhesive tape 150 disposed between the rear surface of the substrate 140 and the heat dissipation member 160 to adhere the rear surface of the substrate 140 and the heat dissipation member 160.

The inorganic light emitting elements 110 may be electrically connected to a pixel driving wiring formed on the mounting surface 144 and a top wiring layer extending through the side surface of the substrate 140 and formed of the pixel driving wiring.

The top wiring layer may be electrically connected to a side wiring formed on the side surface of the substrate 140. The side wiring may have a thin film form.

The top wiring layer may be connected to the side wiring by a top connection pad formed on the edges side of the substrate 140.

The side wiring may extend along the side surface of the substrate 140 to be connected to a rear wiring layer 146 formed on the rear surface.

An insulating layer 147 provided to cover the rear wiring layer 146 may be formed on the rear wiring layer 146 in a direction in which the rear surface of the substrate 140 faces.

That is, the plurality of inorganic light emitting elements 110 may be sequentially electrically connected to the top wiring layer, the side wiring, and the rear wiring layer 146.

As described above, the heat dissipation member 160 may be in contact with the substrate 140. The heat dissipation member 160 and the substrate 140 may be adhered to each other by the adhesive tape 150 disposed between the rear surface of the substrate 140 and the heat dissipation member 160.

The heat dissipation member 160 may be formed of a material with high thermal conductivity or may be implemented in a configuration with high thermal conductivity. For example, the heat dissipation member 160 may be made of aluminum.

Heat generated from the inorganic light emitting elements 110 and the TFT layer 142 mounted on the substrate 140 may be transferred to the heat dissipation member 160 through the adhesive tape 150 along the rear surface of the substrate 140.

Accordingly, heat generated in the substrate 140 may be easily transferred to the heat dissipation member 160 and a temperature of the substrate 140 may be prevented from rising above a certain temperature.

The display modules 101 may be arranged in various positions in the form of the M*N matrix, respectively. Each of the display modules 101 is individually movable. In this case, each of the display modules 101 may individually include the heat dissipation member 160, so that regardless of where each of the display modules 101 is positioned, a certain level of heat dissipation performance may be maintained.

The plurality of display modules 101 may form screens of various sizes of the display apparatus 1 in various forms of the M*N matrix. Accordingly, compared to heat dissipation through a single heat dissipation member provided for heat dissipation, as each of the display modules 101 includes the independent heat dissipation member 60, individual heat dissipation of each of the display modules 101 may improve the heat dissipation performance of the entire display apparatus 1.

When the single heat dissipation member 160 is disposed inside the display apparatus 1, a portion of the heat dissipation member 160 may not be disposed in positions corresponding to positions where some display modules are disposed based on the front-rear direction, and the heat dissipation member 160 may be disposed in a position where the display module 101 is not disposed, so that the heat dissipation efficiency of the display apparatus 1 may be reduced.

That is, through the heat dissipation member 160 disposed in each of the display modules 101, regardless of where each of the display modules 101 is disposed, all of the display modules 101 may enable their own heat dissipation through each of the heat dissipation members 160, thereby improving the heat dissipation performance of the entire display apparatus 1.

The heat dissipation member 160 may have a quadrangle shape substantially corresponding to the shape of the substrate 140.

An area of the substrate 140 may be at least equal to or larger than an area of the heat dissipation member 160. When the substrate 140 and the heat dissipation member 160 are arranged side by side toward the front, the four edges of the substrate 140 having a rectangular shape based on a center of the substrate 140 and the heat dissipation member 160 may be formed to correspond to four edges of the heat dissipation member 160, or may be disposed further outside than the four edges of the heat dissipation member 160 based on the center of the substrate 140 and the heat dissipation member 160.

Appropriately, the four edges of the substrate 140 may be disposed further outside than the four edges of the heat dissipation member 160. That is, the area of the substrate 140 may be larger than the area of the heat dissipation member 160.

This is because the substrate 140 and the heat dissipation member 160 may be thermally expanded when heat is transferred to each of the display modules 101, and the heat dissipation member 160 has a thermal expansion coefficient greater than a thermal expansion coefficient of the substrate 140, so that an expansion value of the heat dissipation member 160 is higher than an expansion value of the substrate 140.

In this case, in a case in which the four edges of the substrate 140 correspond to the four edges of the heat dissipation member 160 or are disposed further inside than the four edges of the heat dissipation member 160, the edges of the heat dissipation member 160 may protrude to the outside of the substrate 140.

Because of this, an interval length of gaps formed between the respective display modules 101 may be formed irregularly due to thermal expansion of the heat dissipation member 160 of each of the display modules 101, and accordingly, perception of some seams may increase and a sense of unity of the screen of the display panel 100 may decrease.

However, in a case in which the four edges of the substrate 140 are disposed further outside than the four edges of the heat dissipation member 160, the heat dissipation member 160 does not protrude to the outside of the four edges of the substrate 140 even when the substrate 140 and the heat dissipation member 160 are thermally expanded, and accordingly, the interval length of the gaps formed between the respective display modules 101 may be kept constant.

According to an embodiment of the present disclosure, the area of the substrate 140 and the area of the heat dissipation member 160 may be provided to substantially correspond to each other. Accordingly, the heat generated in the substrate 140 is not isolated in some regions and may be uniformly dissipated throughout the entire region of the substrate 140.

The heat dissipation member 160 may be adhered to the rear surface of the substrate 140 using the adhesive tape 150.

The adhesive tape 150 may be provided in a size corresponding to the heat dissipation member 160. That is, an area of the adhesive tape 150 may be provided to correspond to the area of the heat dissipation member 160. The heat dissipation member 160 may have a substantially quadrangle shape, and the adhesive tape 150 may have a quadrangle shape to correspond thereto.

The edges of the heat dissipation member 160 and edges of the adhesive tape 150, which have a rectangular shape based on a center of the heat dissipation member 160 and the adhesive tape 150, may be formed to correspond to each other.

Accordingly, the heat dissipation member 160 and the adhesive tape 150 may be easily manufactured in one combined configuration, thereby increasing a manufacturing efficiency of the entire display apparatus 1.

That is, when the heat dissipation member 160 is cut into unit numbers from one plate, the adhesive tape 150 is pre-adhered to the one plate before the heat dissipation member 160 is cut, and the adhesive tape 150 and the heat dissipation member 160 are cut simultaneously in unit numbers, thereby reducing the number of processes.

Heat generated from the substrate 140 may be transferred to the heat dissipation member 160 through the adhesive tape 150. Accordingly, the adhesive tape 150 may adhere the heat dissipation member 160 to the substrate 140 and simultaneously transfer heat generated from the substrate 140 to the heat dissipation member 160.

Accordingly, the adhesive tape 150 may include a material with high heat dissipation performance.

The adhesive tape 150 may include a material having adhesiveness in order to adhere the substrate 140 and the heat dissipation member 160.

The adhesive tape 150 may include a material with heat dissipation performance rather than a material with general adhesiveness. Accordingly, heat may be efficiently transferred to each component between the substrate 140 and the heat dissipation member 160.

Additionally, the material having adhesiveness of the adhesive tape 150 may be formed of a material with higher heat dissipation performance than the adhesive material constituting a general adhesive.

A material with high heat dissipation performance refers to a material capable of effectively transferring heat due to its high thermal conductivity, high heat transferability, and low specific heat.

As an example, the adhesive tape 150 may include a graphite material. However, the adhesive tape 150 is not limited thereto and may be a material with generally high heat dissipation performance.

Ductility of the adhesive tape 150 may be greater than ductility of the substrate 140 and ductility of the heat dissipation member 160. Therefore, the adhesive tape 150 may be a material having high ductility while having adhesiveness and heat dissipation properties. The adhesive tape 150 may be formed of an inorganic double-sided tape. Because the adhesive tape 150 is formed of an inorganic double-sided tape, the adhesive tape 150 may be formed as a single layer between one surface thereof adhered to the substrate 140 and the other surface thereof adhered to the heat dissipation member 160 without a member for supporting the one surface and the other surface.

Because the adhesive tape 150 does not include the member, the adhesive tape 150 does not include a material that interferes with heat conduction, and thus heat dissipation performance may be improved. However, the adhesive tape 150 is not limited to the inorganic double-sided tape and may be a heat-dissipating tape with better heat dissipation performance than a general double-sided tape.

Because the substrate 140 is composed of a glass material and the heat dissipation member 160 is composed of a metal material, material properties of the respective compositions are different, so that degrees to which the materials are deformed by the same heat may be different. That is, when heat is generated in the substrate 140, the substrate 140 and the heat dissipation member 160 may each be thermally expanded to different sizes due to the heat. Accordingly, the display module 101 may be damaged.

This is because the expansion values of the substrate 140 and the heat dissipation member 160 at the same temperature are different in a state in which the substrate 140 and the heat dissipation member 160 are fixed to each other, and thus as the substrate 140 and the heat dissipation member 160 are expanded to different sizes, stress may occur in each of the components.

Among the material properties, especially thermal expansion coefficients of the materials are different, so that the degrees to which the materials are physically deformed by heat are different, and because a thermal expansion coefficient of a metal material is generally greater than that of glass, when the same heat is transferred to the substrate 140 and the heat dissipation member 160, the heat dissipation member 160 may be expanded and be deformed more than the substrate 140.

Conversely, even when the heat generation in the substrate 140 is terminated and the substrate 140 and the heat dissipation member 160 are cooled, respectively, the heat dissipation member 160 may be contracted and deformed more than the substrate 140.

Because the substrate 140 and the heat dissipation member 160 are in a state of being adhered to each other by the adhesive tape 150, when the heat dissipation member 160 is deformed more than the substrate 140, an external force may be transmitted to the substrate 140.

Conversely, an external force may also be transmitted to the heat dissipation member 160 by the substrate 140, but because a rigidity of the glass substrate 140 is lower than a rigidity of the metal heat dissipation member 160, the substrate 140 may be damaged.

The adhesive tape 150 may absorb external forces transmitted from different components between the substrate 140 and the heat dissipation member 160 as the substrate 140 and the heat dissipation member 160 are expanded to different sizes.

Accordingly, an external force may be prevented from being transmitted to the substrate 140 and the heat dissipation member 160, and the substrate 140 may be prevented from being damaged.

The adhesive tape 150 may be made of a material having high ductility to absorb the external force transmitted from the substrate 140 and the heat dissipation member 160. The ductility of the adhesive tape 150 may be greater than the ductility of the substrate 140 and the ductility of the heat dissipation member 160.

Accordingly, when an external force generated from changes in the sizes of the substrate 140 and the heat dissipation member 160 is transmitted to the adhesive tape 150, as the adhesive tape 150 itself is deformed, the external force may be prevented from being transmitted to different components.

The adhesive tape 150 may have a predetermined thickness in the front direction. When the heat dissipation member 160 is thermally expanded as heat is transferred thereto or cooled and contracted, the heat dissipation member 160 may be expanded or contracted not only in the front direction, but also in a direction orthogonal to the front, and accordingly, the external force may be transmitted to the substrate 140.

As described above, the display panel 100 may display the screen using the plurality of display modules 101. In this case, the sense of unity of the screen may decrease due to seams formed by the gaps formed between the plurality of display modules 101.

Accordingly, in order to minimize the perception of the seams of the display panel 100, the plurality of display modules 101 may be arranged on the frame 10 (FIG. 3) to form a constant gap. This is because when the gaps formed by the plurality of display modules 101 are not constant, the perception of the seams due to some gaps may be amplified.

In the case of the conventional display apparatus 1, the frame 10 supporting the display panel 100 is made of metal. The plurality of display modules 101 may be tiled on the frame 10 made of metal.

As the display apparatus 1 is driven, the substrate 140 forming the plurality of display modules 101 may be thermally expanded by heat generated from the display panel 100, and in this case, as described above, the plurality of display modules 101 is supported on the frame 10 made of metal, and the gaps between the plurality of display modules 101 are formed irregularly due to thermal expansion of the substrate 140 and the frame 10, so that the perception of the seams may be amplified.

That is, the substrates 140 of the plurality of display modules 101 are all made of glass, so that each of the substrates 140 may thermally expand to a certain value, and in this case, due to thermal expansion of the metal frame 10 supporting each of the substrates 140, widths of some of the gaps between the plurality of display modules 101 may be formed irregularly. This is because material properties of the metal material and material of the glass material are different.

The material properties of a material may vary depending on a thermal expansion coefficient, specific heat, thermal conductivity, and the like. Degrees of thermal expansion of the substrate 140 and the frame 10 may be different due to a difference between the thermal expansion coefficient of the metal material and the thermal expansion coefficient of the glass.

As the frame 10 itself attached to the plurality of display modules 101 is thermally expanded in addition to the thermal expansion of the substrates 140 of the plurality of display modules 101, the interval length of the gaps between the plurality of display modules 101 may vary irregularly.

As such, in order to prevent the gaps between the plurality of display modules 101 due to thermal expansion from being formed irregularly as the plurality of display modules 101 is arrayed on the frame 10 made of metal, the frame 10 of the display apparatus 1 according to an embodiment of the present disclosure may be made of a material to which the plurality of display modules 101 is adhered and having material properties similar to those of the substrates 140 of the plurality of display modules 101.

That is, the frame 10 may have material properties similar to those of the substrate 140 so that the interval length of the gaps formed between the respective display modules 101 is kept constant.

The meaning of being formed with material properties similar to those of the substrate 140 described above may include the meaning of being similar to the thermal expansion coefficient, specific heat, and thermal conductivity of the substrate 140. According to an embodiment of the present disclosure, this may be interpreted to mean that the thermal expansion coefficient of the substrate 140 corresponds to the thermal expansion coefficient of the frame 10.

The frame 10 may be formed entirely of a material similar to the material properties of the substrate 140 or may be made of a material having a similar thermal expansion coefficient value. Appropriately, the frame 10 may be formed of a material having the same thermal expansion coefficient value as that of the substrate 140.

The frame 10 is not limited thereto and may include a front layer formed of a material having material properties corresponding to those of the substrate 140.

As the substrate 140 is adhered to the front layer toward the front, the substrate 140 and the front layer may be expanded to corresponding lengths when the same heat is transferred to the substrate 140 and the front layer in the second or third direction orthogonal to the front.

That is, when the frame 10 is formed entirely of a material having material properties corresponding to those of the substrate 140 or only the front layer constituting a front surface of the frame 10 is formed of a material having material properties corresponding to those of the substrate 140, the front surface of the frame 10 to which the substrate 140 of the display module 101 is adhered may be thermally expanded to the same value as the substrate 140 when the substrate 140 of the display module 101 is thermally expanded by heat generated while the display apparatus 1 is operating.

As the front surface of the frame 10, which is a base surface to which the display module 101 is adhered, is thermally expanded to the same value as the substrate 140 of the display module 101, the intervals of the gaps formed between the display modules 101 may be kept the same.

Accordingly, the interval length between the gaps formed between the plurality of display modules 101 may be kept the same as in a state in which the substrate 140 is not thermally expanded, so that a certain level of seams may be kept and the sense of unity of the screen of the display panel 100 may be kept.

Therefore, even when heat generated by driving the display apparatus 1 is supplied to the substrates 140 of the plurality of display modules 101, the interval length of the gaps between the plurality of display modules 101 is kept constant, so that the sense of unity of the screen may be prevented from decreasing by amplifying some seams.

The frame 10 is provided to support the display panel 100 and may have a rigidity of a certain strength or more. Accordingly, the frame 10 may be formed of a metal material having a rigidity of a certain strength or more, and the front surface of the frame 10 may be formed of a glass material corresponding to the substrate 140. However, the frame 10 is not limited thereto and may be formed of a material having a value different from the thermal expansion coefficient of the substrate 140.

One or more embodiments of the display panel 100 including the inorganic light-light emitting elements 110 has been described above. The configuration of the display apparatus 1 will be described below, focusing on the method by which the display panel 100 is combined within the display apparatus 1.

Figure 3:
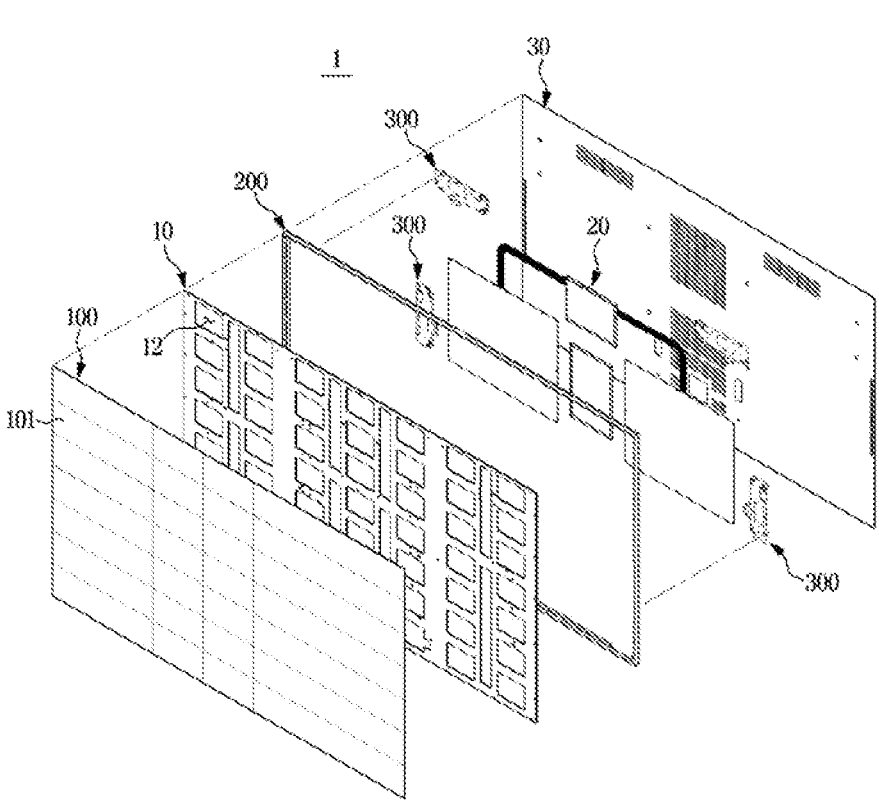
FIG. 3 is an exploded perspective view of the display apparatus of FIG. 1 according to an embodiment of the disclosure.

FIG. 3 is an exploded perspective view of the display apparatus 1 of FIG. 1.

As illustrated in FIG. 3, the frame 10 having a shape corresponding to the display panel 100 may be provided at the rear of the display panel 100. Therefore, the frame 10 may have a rectangular shape like the display panel 100.

The display panel 100 may be coupled to the frame 10. As described above, the frame 10 may support the display panel 100. In a case in which the display panel 100 includes the inorganic light emitting elements 110 that emit light by themselves, the display apparatus 1 may not require a separate backlight. In a received-light emitting display apparatus including a backlight, the rear chassis supporting the backlight may serve to support the display panel 100, but in the display apparatus 1 that does not have a backlight, a separate component may be needed to support the display panel 100. In a case in which the frame 10 having a rigidity capable of supporting the display panel 100 is coupled to the rear of the display panel 100, problems such as the display panel 100 being bent may be prevented.

The frame 10 may include module openings 12 penetrating in the front-rear direction. The display module 101 and a driving circuit board 20 located at the rear of the frame 10 may be connected through the module opening 12.

The front chassis 200 extending along edges of the display panel 100 may be provided. The front chassis 200 may cover at least a portion of the edges of the display panel 100.

Because the display panel 100 may have a rectangular shape, the front chassis 200 may also have a shape extending along a rectangular edge.

Because the frame 10 may have a shape corresponding to the display panel 100, the front chassis 200 may have a shape extending along edges of the frame 10.

The front chassis 200 may be formed to extend toward the inside of the display apparatus 1. The front chassis may be formed to extend in a plane direction parallel to the display panel 100. The frame 10 may be seated in and coupled to an accommodation space 240 (FIG. 11) formed by this shape. The frame 10 may be supported by this part.

Various electrical components for driving the display apparatus 1 may be located at the rear of the frame 10. The driving circuit board 20 provided to drive the display panel 100 or the display module 101 may be located at the rear of the frame 10.

A speaker module 300 configured to output sound may also be located at the rear of the frame 10.

A rear cover 30 may be provided at the rear of the electrical components located at the rear of the frame 10 to cover the rear of these electrical components and the frame 10.

Edges of the rear cover 30 may be coupled to the front chassis 200. Thereby, the rear cover 30 may be supported.

One or more embodiments of the configuration that the display apparatus 1 may include has been described above. The display apparatus 1 may include the speaker module 300. One or more embodiments of the speaker module 300 will be described below.

Figure 4:
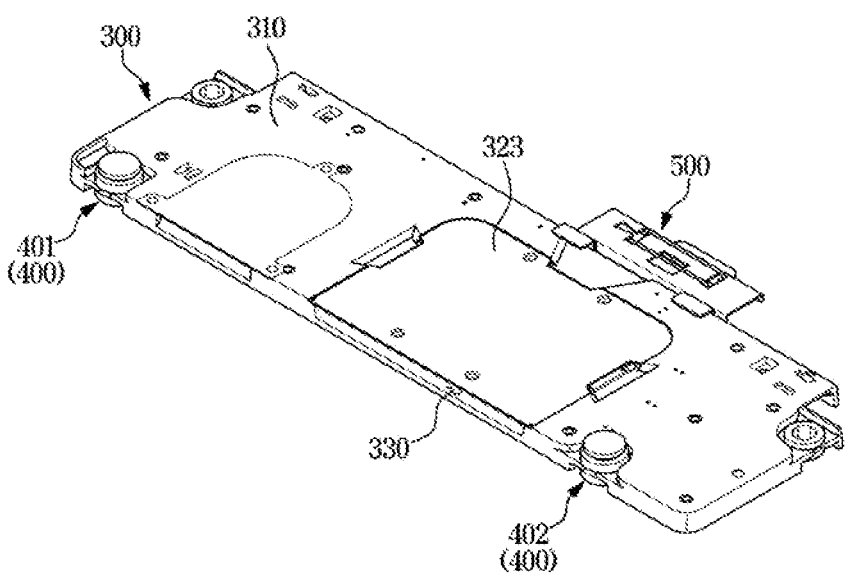
FIG. 4 is a perspective view illustrating that a speaker module, a module mount, and a fixer are combined according to an embodiment of the disclosure.
Figure 5:
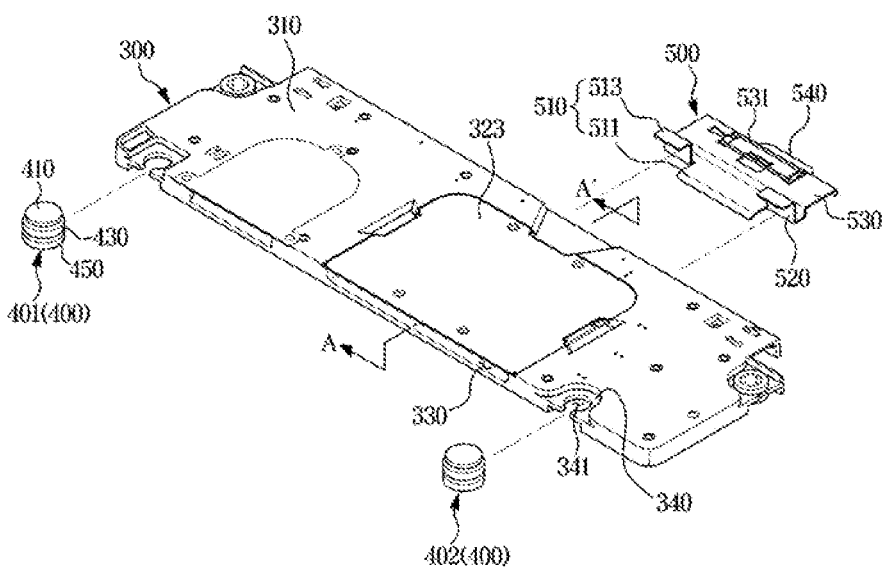
FIG. 5 is an exploded perspective view illustrating that the speaker module, the module mount, and the fixer illustrated in FIG. 4 are disassembled according to an embodiment of the disclosure.
Figure 6:
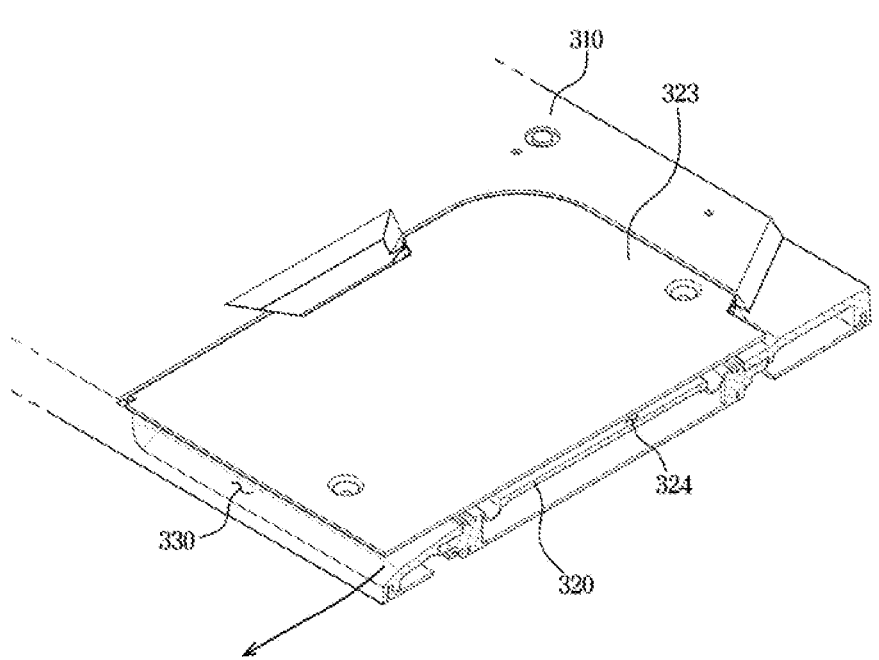
FIG. 6 is a cross-sectional perspective view taken along line AA' of the speaker module of FIG. 5 according to an embodiment of the disclosure.

FIG. 4 is a perspective view illustrating that the speaker module 300, a module mount 400, and a fixer 500 are combined. FIG. 5 is an exploded perspective view illustrating that the speaker module 300, the module mount 400, and the fixer 500 illustrated in FIG. 4 are disassembled. FIG. 6 is a cross-sectional perspective view taken along line AA' of the speaker module 300 of FIG. 5.

As illustrated in FIGS. 4, 5, and 6, the speaker module 300 may include a module emitting hole 330 through which a sound may be emitted to a side edge thereof.

As illustrated in FIG. 6, a speaker 320 may be provided such that an area of a portion through which a sound is emitted is wide and a thickness thereof is small compared to the area.

In a case in which the display apparatus 1 includes the speaker 320, because a user is located in front of the display apparatus 1, it is appropriate that the portion where a sound is emitted from the speaker 320 directs to the front.

However, because the display panel 100 may be located in front of the display apparatus 1, when the sound emitting portion of the speaker 320 emitting a sound faces the front, the sound is blocked by the display panel 100 and the quality of the sound deteriorates. The speaker 320 may be located on a side of the display panel 100 so that the sound emitting portion of the speaker 320 directs to the front, but in this case, because a bezel is formed on the side of the display panel 100, aesthetics may be reduced.

In this case, when the sound emitting portion of the speaker 320 is located on a side of the display apparatus 1, because the sound emitting portion of the speaker 320 is wide, a thickness of the display apparatus 1 may appear thick. This may deteriorate the aesthetics of the display apparatus 1.

Reflecting this point, the speaker 320 may be coupled such that the portion of the speaker 320 from which a sound is emitted directs to the rear.

Because in the above method, a sound is emitted in a direction opposite to the front direction of the display apparatus 1 where the user is located, it is difficult for the user to immediately recognize the sound, and a distance that the sound travels to the user is long, so that there is a lot of room for disturbances to interfere with the sound.

One or more embodiments of the speaker module 300 in the present disclosure, even though the portion from which a sound of the speaker 320 is emitted is wide, may provide the speaker module 300 that allows the sound to be emitted from the side of the display apparatus 1 and at the same time does not make the display apparatus 1 thick.

The speaker module 300 may further include a reflector 323 provided to face the sound emitting portion of the speaker 320 and be spaced apart at a predetermined distance.

A gap protrusion 322 (FIG. 17) may be provided between the reflector 323 and the speaker 320 so that the reflector 323 and the speaker 320 are spaced apart from each other.

The reflector 323 may extend to the module emitting hole 330 that may be formed on the side edge of the speaker module 300. In addition, a space formed by the separation between the reflector 323 and the sound emitting portion of the speaker 320 may extend to the module emitting hole 330 to form an acoustic passage 324.

Accordingly, while the sound emitting portion of the speaker 320 still directs to the rear, the sound emitting portion of the speaker module 300 may direct to the side. Because a thickness in a lateral direction may be smaller than a width in the front-rear direction, even when the speaker module 300 is located on the side of the display apparatus 1, the thickness of the display apparatus 1 may not be increased.

The speaker module 300 may include a module body 310 so that the speaker 320 may be mounted thereon. The module body 310 may form an exterior of the speaker module 300. Therefore, a thickness of the module body 310 may be the thickness of the speaker module 300. An empty space may be formed inside the module body 310. The empty space may be formed by supporting the speaker 320 and the module body 310 by a spacer protrusion 321 (FIG. 13) located therebetween. The empty space formed by this arrangement may serve as a sound box for the sound emitted from the speaker 320.

The speaker module 300 may include the two speakers 320.

The module mount 400 may be coupled to the speaker module 300. The module mount 400 is a member for coupling the speaker module 300 to the front chassis 200. Because the module emitting hole 330 of the speaker module 300 is positioned to face the front chassis 200, the module mount 400 may be coupled to the speaker module 300 at a side where the speaker module 300 is coupled to the front chassis 200.

The module mount 400 may have an overall cylindrical shape.

The module mount 400 may include an elastic member to facilitate deformation.

The module mount 400 may have a head portion 410 at one end thereof. An insertion portion 420 extending from the head portion 410 toward the other end of the module mount 400 and having a smaller cross section than the head portion 410 may be included. A separation prevention portion 430 extending from the insertion portion 420 toward the other end of the module mount 400 and having a larger cross-section than the insertion portion 420 may be formed. A module mounting portion 440 extending from the separation prevention portion 430 toward the other end of the module mount 400 and having a smaller cross section than the separation prevention portion 430 may be formed. An insertion groove support portion 450 extending from the module mounting portion 440 toward the other end of the module mount 400 and having a larger cross-section than the module mounting portion 440 may be formed. Effects resulting from providing each configuration will be described below with reference to the related drawings.

The module mount 400 may be detachable from the speaker module 300. The separated module mount 400 may be capable of being coupled to the speaker module 300. The speaker module 300 may include an insertion groove forming portion 340 so that an insertion groove 341 is formed at a position where the module mount 400 is to be coupled. The insertion groove forming portion 340 may have a shape of being recessed inward from the surrounding module body 310.

Corresponding to the shape in which the insertion groove forming portion 340 is recessed inward, the module mount 400 includes the separation prevention portion 430 extending to one side of the insertion groove forming portion 340 and the insertion groove support portion 450 supporting the other side of the insertion groove forming portion 340. Accordingly, the module mount 400 may be prevented from being separated from the insertion groove 341.

A height of the separation prevention portion 430 may be from one side of the insertion groove forming portion 340 to an outer surface of the module body 310.

A height of the insertion groove support portion 450 may be from the other side of the insertion groove forming portion 340 to the outer surface of the module body 310.

Accordingly, a length from the separation prevention portion 430 to the insertion groove support portion 450 may be the same as the thickness of the module body 310.

In other words, the module mount 400 may be accommodated in the insertion groove 341. In this case, a portion accommodated in the insertion groove 341 is the module mounting portion 440 of the module mount 400. The module mounting portion 440 may have a shape corresponding to the insertion groove 341. Accordingly, the module mounting portion 440 may be inserted into the insertion groove 341 with a forced fitting. Because the module mounting portion 440 is coupled to the insertion groove 341 with force fitting, the module mounting portion 440 may not be easily separated from the insertion groove 341.

The module mount 400 may include a deformable groove 460 (FIG. 13) at a central portion of the module mount 400 to be deformable when the module mounting portion 440 is inserted into the insertion groove 341. Because the module mount 400 may be an elastic member, deformation may occur while the module mount 400 is inserted into any groove. As the module mount 400 may be easily inserted into a groove due to deformation, the module mount 400 may be easily inserted into the insertion groove 341 due to the deformable groove 460.

Figure 9:
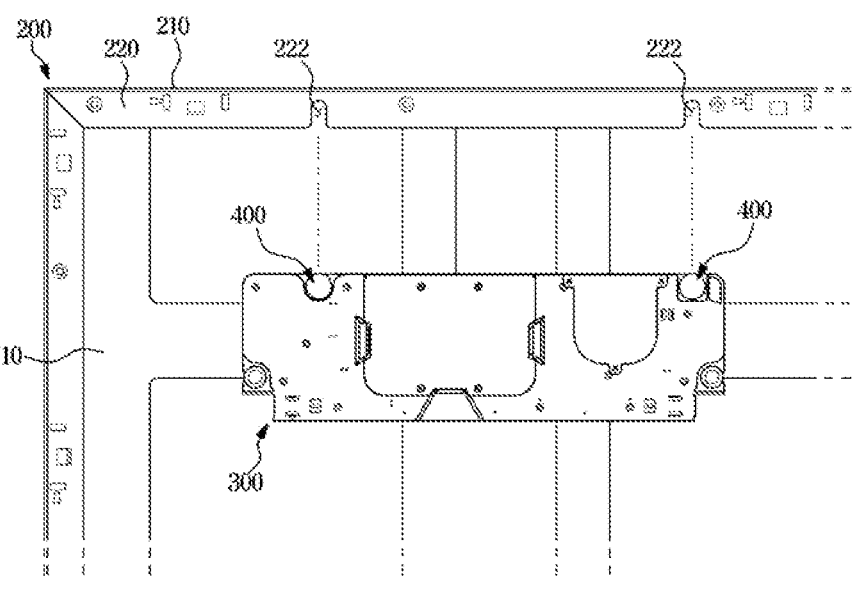
FIG. 9 is a rear view viewed from the rear of FIG. 7 according to an embodiment of the disclosure.

As will be described later, by this manner, the deformable groove 460 located at the central portion of the module mount 400 may assist in deforming the mount when the mount is inserted into a sliding groove 222 (FIG. 9).

The module mount 400 is provided on one side of the speaker module 300 and may include a first module mount 401 and a second module mount 402 located on opposite sides with respect to a center thereof.

A fixer 500 provided to couple the speaker module 300 to the frame 10 may be included to prevent movement of the speaker module 300 in the front-rear direction.

The fixer 500 may include a support part 510 supporting the speaker module 300 on one side thereof and a coupling part 540 coupled to the frame 10 on the other side thereof.

The fixer 500 will be described in detail below with reference to the related drawings.

The speaker module 300 described above may be coupled to the front chassis 200. Hereinafter, a method by which the speaker module 300 is coupled to the front chassis 200 will be described in detail.

Figure 7:
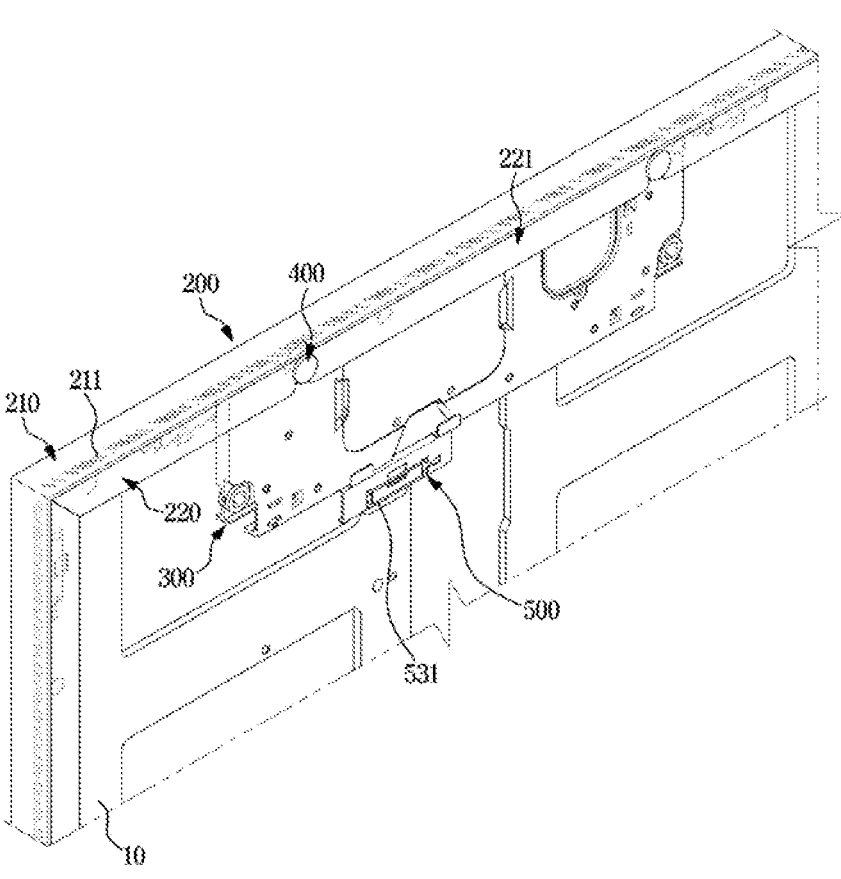
FIG. 7 is a perspective view illustrating a front chassis, a frame, the speaker module, the module mount, and the fixer in order to illustrate that the speaker module is coupled to the front chassis in the display apparatus of FIG. 6 according to an embodiment of the disclosure.

FIG. 7 is a perspective view illustrating the front chassis 200, the frame 10, the speaker module 300, the module mount 400, and the fixer 500 in order to illustrate that the speaker module 300 is coupled to the front chassis 200 in the display apparatus 1 of FIG. 6.

As illustrated in FIG. 7, the speaker module 300 may be coupled to the front chassis 200.

The front chassis 200 may include a side exterior part 210 provided to cover a side of the display panel 100 or frame 10 and including a chassis emitting hole 211, and a rear flange 220 extending from the side exterior part 210 toward the inside of display apparatus 1. The front chassis 200 may be formed to extend in the plane direction parallel to the display panel 100.

The rear flange 220 may provide a coupling position such that the rear cover 30 may be coupled at edges thereof. Accordingly, the rear flange 220 may include a coupling surface in a direction of facing the rear cover 30.

Figure 10:
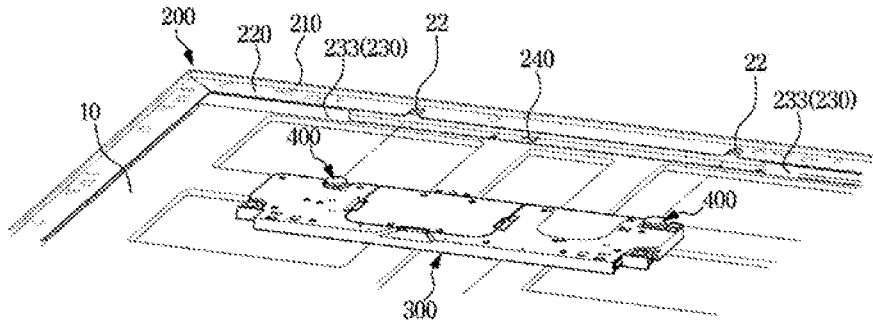
FIG. 10 is a perspective view of FIG. 9 viewed from a different angle according to an embodiment of the disclosure.

Referring to FIG. 10, the accommodation space 240 surrounded by a rear surface of the frame 10 or the display panel 100, the side exterior part 210, and the rear flange 220 may be provided. At least a portion of the speaker module 300 may be located in the accommodation space 240. Accordingly, the module emitting hole 330 of the speaker module 300 may be adjacent to and face the chassis emitting hole 211.

The module mount 400 may support the speaker module 300 on the front chassis 200 to prevent the speaker module 300 from being separated from the accommodation space 240, and may be coupled to the front chassis 200 and the speaker module 300.

In this case, the front chassis 200 may include a mount coupling part 221 capable of being slidably coupled to the module mount 400.

As will be described below, in an embodiment, the mount coupling part 221 has been described with reference to the sliding groove 222. However, as long as a configuration may be coupled to the module mount 400 to fix the speaker module 300 to the front chassis 200 when at least a portion of the speaker module 300 is slid and accommodated in the accommodation space 240, the member may become the mount coupling part 221.

However, the mount coupling part 221 may be a member capable of sliding and fix the speaker module 300 in the accommodation space 240. This is because when the speaker module 300 is moved in the front-rear direction to be located in the accommodation space 240, the speaker module 300 may avoid the rear flange 220 at the mount coupling part 221 so that the speaker module 300 may be moved. Avoiding the rear flange 220 means cutting a portion of the front chassis 200, which may weaken a rigidity of the front chassis 200. As a result, the front chassis 200 may not be able to properly support surrounding members. In addition, avoidance processing requires an additional separate process, which may lead to an increased production time and production cost.

In other words, this means that the speaker module 300 may be inserted into the accommodation space 240 by sliding along an extension direction of the rear flange 220, and the mount coupling part 221 may be located in the front chassis 200 where the speaker module 300 slides.

The fixer 500 may include a cover coupling part 530 (FIG. 5) coupled to the rear cover 30. The cover coupling part 530 and the rear cover 30 may be coupled by adhesive or screws. In an embodiment, the cover coupling part 530 may include a wire 531, and the rear cover 30 includes a hook on which the wire 531 is caught, so that the wire 531 is caught on the hook, thereby coupling the rear cover 30 to the fixer. Also, the rear cover 30 may be coupled to the rear flange 220 of the front chassis 200 using a wire and a hook. By being coupled as above, the rear cover may be coupled without screws, so that the rear cover may be easily disassembled. Therefore, this structure may be a structure that makes it easy to disassemble the rear cover 30 and replace the electrical components provided inside. However, this is only an example, and the method of coupling the rear cover 30 is not limited thereto.

Figure 8:
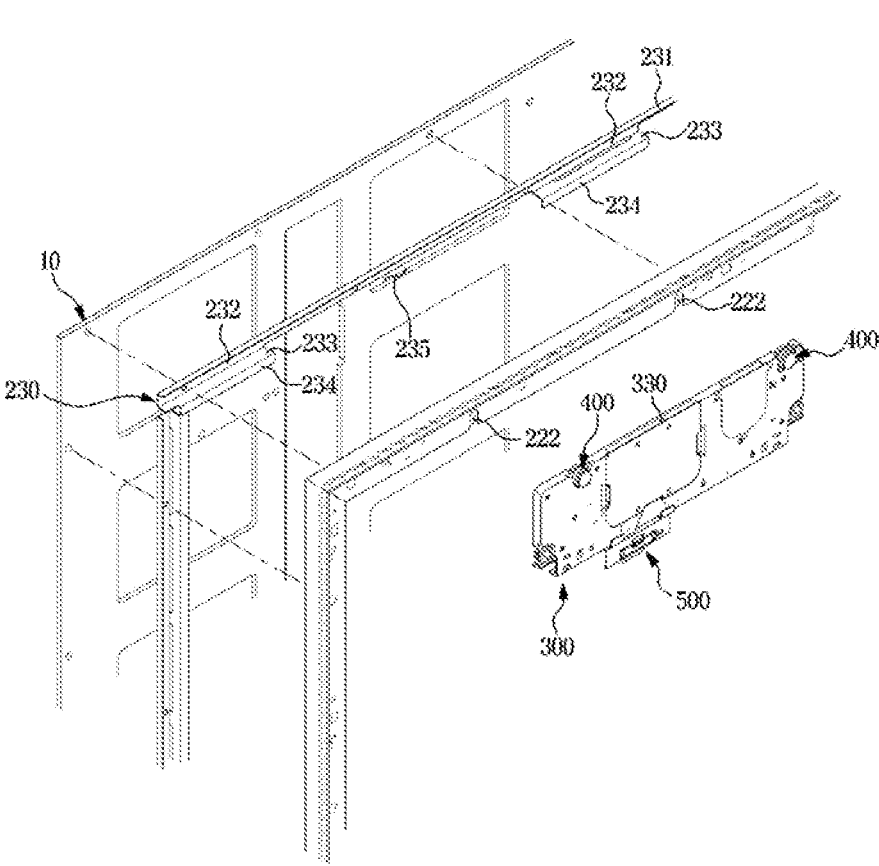
FIG. 8 is an exploded perspective view of the components illustrated in FIG. 7 according to an embodiment of the disclosure.

FIG. 8 is an exploded perspective view of the components illustrated in FIG. 7.

As illustrated in FIG. 8, the front chassis 200 may include a reinforcing member 230 on an inner side thereof. The reinforcing member 230 may serve to supplement the rigidity of the front chassis 200. The reinforcing member 230 may be formed to extend along the side exterior part 210.

The reinforcing member 230 may include a side contact portion 231 in contact with and support an inner side of the side exterior part 210. A frame contact portion 232 bent from the side contact portion 231 and extending toward the inside of the display apparatus 1 and in contact with the frame 10 may be provided. A reinforcing support portion 233 bent and extending from the frame contact portion 232 toward the rear flange 220 may be provided. The frame contact portion 232 of the reinforcing member 230 may support the frame 10 from the rear. A flange contact portion 234 bent and extending from the reinforcing support portion 233 to be in contact with and support the rear flange 220 may be provided.

The side contact portion 231 of the reinforcing member 230 and the frame contact portion 232 formed to extend therefrom may be formed to extend along the side exterior part 210. However, the reinforcing support portion 233 and the flange contact portion 234 extending therefrom may not be formed in one area after being formed along the side exterior part 210. Therefore, a plurality of the reinforcing support portions 233 and a plurality of the flange contact portions 234 may be provided.

An accommodation opening 235 may be provided between the plurality of reinforcing support portions 233 of the reinforcing member 230. The speaker module 300 may be accommodated in the accommodation opening 235 so that at least a portion of the speaker module 300 may be located in the accommodation space 240.

The mount coupling part 221 may include the sliding groove 222 extending from an end of the rear flange 220 toward the side exterior part 210 and into which the module mount 400 may be slidably inserted.

Hereinafter, a process of inserting at least a portion of the speaker module 300 into the accommodation space 240 will be described.

FIG. 9 is a rear view viewed from the rear of FIG. 7. FIG. 10 is a perspective view of FIG. 9 viewed from a different angle.

As illustrated in FIGS. 9 and 10, the speaker module 300 may be moved toward the sliding groove 222 provided on the front chassis 200. In this case, what is inserted into the sliding groove 222 may be the module mount 400 coupled to the speaker module 300. The module mount 400 may have a cylindrical shape sized to be inserted into the sliding groove 222.

In other words, the speaker module 300 may be moved toward the accommodation space 240. As described above, the accommodation space 240 is in communication with the outside through the accommodation opening 235 provided between a plurality of the support parts 510, the speaker module 300 may be accommodated in the accommodation space 240.

Figure 11:
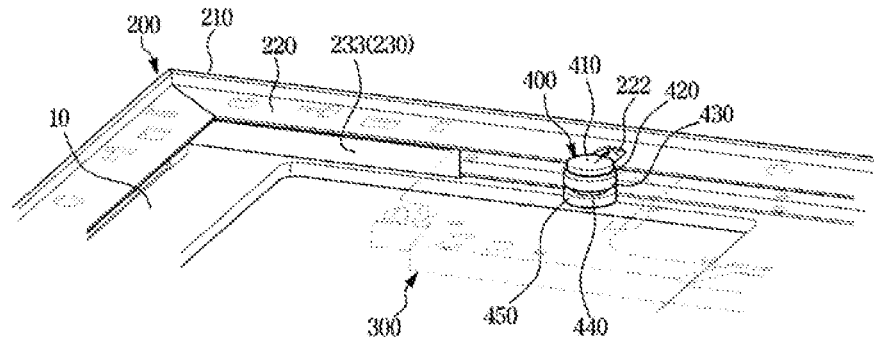
FIG. 11 is a perspective view illustrating a process in which the speaker module of FIG. 3 is accommodated in an accommodation space according to an embodiment of the disclosure.
Figure 12:
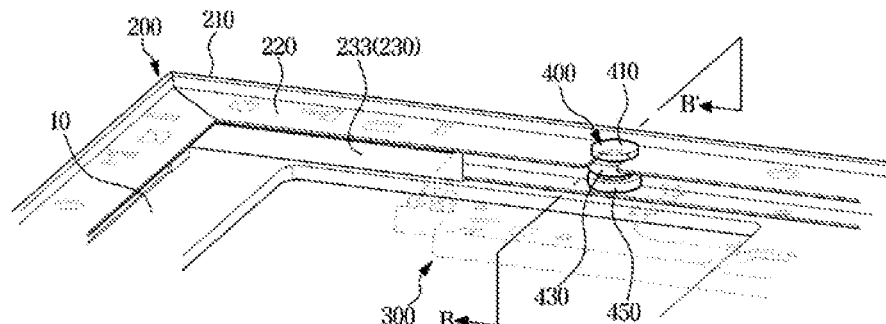
FIG. 12 is a perspective view illustrating that the speaker module of FIG. 11 is completely accommodated in the accommodation space according to an embodiment of the disclosure.

FIG. 11 is a perspective view illustrating a process in which the speaker module 300 of FIG. 3 is accommodated in the accommodation space 240. FIG. 12 is a perspective view illustrating that the speaker module 300 of FIG. 11 is completely accommodated in the accommodation space 240.

As illustrated in FIGS. 11 and 12, the module mount 400 may be slidably inserted into the sliding groove 222. More specifically, the insertion portion 420 of the module mount 400 may be seated in the sliding groove 222.

The module mount 400 may be moved along the sliding groove 222. Because the sliding groove 222 extends from the end of the rear flange 220 toward the side exterior part 210, the module mount 400 may be moved by sliding toward the side exterior part 210.

Because the module mount 400 may be coupled to the speaker module 300, as the module mount 400 is moved, the speaker module 300 may also be moved toward the side exterior part 210. Because a side to which the module mount 400 is coupled may be a side where the module emitting hole 330 of the speaker module 300 is located, as the module mount 400 is moved toward the side exterior part 210, the module emitting hole 330 may be close to the side exterior part 210. Because the side exterior part 210 includes the chassis emitting hole 211, the module emitting hole 330 may be close to the chassis emitting hole 211.

The module emitting hole 330 may be close to the chassis emitting hole 211 which may improve sound quality.

In a case in which there is an empty space from a source of a sound to a place where the sound is emitted, this empty space may act as a kind of low path filter.

A low pass filter refers to a type of filter that allows only vibrations with frequencies in a low-frequency range to pass through and prevents vibrations with frequencies in a high-frequency range from passing through. In terms of sound, a low pass filter allows only low-frequency sounds to pass through and prevents high-frequency sounds from passing through.

This could explain the phenomenon of a humming sound occurring when shouting in a tunnel. Because this tunnel acts as a low-pass filter, high sounds may not pass through, and low sounds are relatively amplified.

A space between the module emitting hole 330 of the speaker module 300 through which sound is emitted and the chassis emitting hole 211 of the front chassis 200 may be a type of low-pass filter. In this case, the module emitting hole 330 of the speaker module 300 and the chassis emitting hole 211 of the front chassis 200 may be open openings, and in this case, a space between the two may be a type of open pipe.

In the open pipe, destructive interference occurs at some frequencies depending on frequencies, and it may be difficult for vibrations in that frequency band to be transmitted to the outside. For this reason, the space between the module emitting hole 330 of the speaker module 300 and the chassis emitting hole 211 of the front chassis 200 may become a low pass filter.

The smaller a distance between the module emitting hole 330 of the speaker module 300 and the chassis emitting hole 211 of the front chassis 200, the more sound in the high frequency range may be filtered. When a sound range being filtered is above an audible frequency, most users may hear the sound range even when the sound is filtered. In this case, the user may feel that the sound quality is good. Therefore, in order to improve the sound quality, the distance between the module emitting hole 330 of the speaker module 300 and the chassis emitting hole 211 of the front chassis 200 may be reduced.

Therefore, because that the speaker module 300 is coupled by sliding toward the front chassis 200 means that the module emitting hole 330 is close to the chassis emitting hole 211, the sound quality may be improved.

In a case in which the speaker module 300 is to be inserted from the rear to the front toward the accommodation space 240 of the front chassis 200, it is necessary to insert the speaker module 300 while avoiding the rear flange 220 positioned in front of the speaker module 300. In other words, it is necessary to perform a process of cutting a portion of the front chassis 200. Accordingly, manufacturing time may increase due to an additional process. In addition, because a portion of the front chassis 200 needs to be cut, the rigidity of the front chassis 200 may be weakened. This may be fatal in the display apparatus 1 having a thin thickness that requires a high rigidity. In particular, in the case of the self-light emitting display panel 100, a lowered rigidity may be a further problem.

In this case, a case in which the rear flange 220 of the front chassis 200 is not provided may be considered. This is because in that case, even in the case of a method in which the speaker module 300 is slidably coupled is not selected, a portion of the front chassis 200 may not be cut. However, in a case in which the rear flange 220 of the front chassis 200 is not provided, it is difficult to provide a place for the rear cover 30 to be coupled. Accordingly, unless a separate location where the rear cover 30 is coupled is provided, the rear flange 220 is required in the front chassis 200.

In a case in which there is the rear flange 220, because the accommodation space 240 surrounded by the side exterior part 210 and the display panel 100 is formed, in order to insert the speaker module 300 into the accommodation space 240 without cutting the front chassis 200, the method in which the speaker module 300 is slidably coupled to the front chassis 200 may be effective.

The front chassis 200 may include the sliding groove 222 through which the module mount 400 coupled to the speaker module 300 may be slidably inserted to guide the speaker module 300 to be inserted into a correct position.

In other words, the mount coupling part 221 of the front chassis 200 to which the module mount 400 is coupled may include the sliding groove 222 extending from the end of the rear flange 220 toward the side exterior part 210 and into which the module mount 400 may be slidably inserted.

It is important that the speaker module 300 is inserted in the correct position. As described above, the front chassis 200 may include the reinforcing member 230 therein to reinforce the rigidity. The reinforcing member 230 may include the reinforcing support portion 233 positioned to be more biased toward a display central portion than the side exterior part 210. The reinforcing support portion 233 may be formed to face the side exterior part 210. In order for the speaker module 300 to be inserted into the accommodation space 240, the speaker module 300 may be moved toward the accommodation opening 235 (FIG. 8) provided between the reinforcing support portions 233. Because the reinforcing support portion 233 is not formed in the accommodation opening 235, by forming a size of the accommodation opening 235 to correspond to a size of the speaker module 300, a portion of the reinforcing member 230 where the reinforcing support portion 233 is not formed may be minimized. In this case, the speaker module 300 may need to be accurately inserted into the insertion opening. Therefore, by the sliding groove 222 of the front chassis 200 and the module mount 400 slidingly coupled thereto, the speaker module 300 may be guided to be inserted into the correct position of the accommodation opening 235, and at the same time, the speaker module 300 may thereby be coupled to the front chassis 200.

The coupling of the speaker module 300 to the front chassis 200 by the module mount 400 coupled to the speaker module 300 and the sliding groove 222 formed in the front chassis 200 as described above may help improve service speed and quality when a service to replace the speaker module 300 is performed later. Because a member such as screws 542 is not used in the coupling, the service speed may be improved, and because a separate mechanism is not used to tighten and loosen the screw 542, errors that may occur during service may be reduced.

As described above, the module mount 400 may have an overall cylindrical shape.

The module mount 400 may be coupled to the sliding groove 222 with the forced fitting to prevent the speaker module 300 from moving relative to the front chassis 200. When the module mount 400 is an elastic member such as rubber, the module mount 400 may be coupled to the sliding groove 222 with a strong forced fitting. When the module mount 400 is a rigid body such as iron, the module mount 400 may be coupled to the sliding groove 222 with a weak forced fitting. In this case, the strong forced fitting refers to a case in which a diameter of the module mount 400 is not slightly smaller than a width of the sliding groove 222, or the diameter of the module mount 400 is larger than the width of the sliding groove 222. The weak forced fitting refers to a case in which the module mount 400 has the smaller diameter compared to the width of the sliding groove 222 in the strong forced fitting.

When the module mount 400 is an elastic member, deformation may occur while the module mount 400 is inserted into the sliding groove 222. Because even when a situation occurs in which the module mount 400 does not enter the sliding groove 222, the module mount 400 may be deformed, the module mount 400 may be moved into the sliding groove 222 by applying a force to the module mount 400.

In order to facilitate this deformation of the module mount 400, the module mount 400 may include the deformable groove 460 recessed inward. In other words, the module mount 400 may include the deformable groove 460 (FIG. 14) located in the central portion of the module mount 400 so that the module mount 400 may be deformed when inserted into the sliding groove 222.

However, when the module mount 400 is a rigid body, it may be difficult that the module mount 400 is deformed while being inserted into the sliding groove 222. In this case, the module mount 400 may be inserted into the sliding groove 222 only when the module mount 400 is initially designed to enter the sliding groove 222.

The module mount 400 may include the head portion 410 disposed on the outside of the rear flange 220 to be supported on an outer surface of the rear flange 220 when the module mount 400 is inserted into the sliding groove 222. A diameter of the head portion 410 of the module mount 400 may be larger than the width of the sliding groove 222. Therefore, when the user attempts to move the module mount 400 or the speaker module 300 to which the module mount 400 is coupled forward, as the head portion 410 and the rear flange 220 come into contact with each other, it may be difficult to move the module mount 400 and the speaker 320 coupled thereto.

Hereinafter, one or more configurations related to the head portion 410 of the module mount 400 will be described in more detail.

Figure 13:
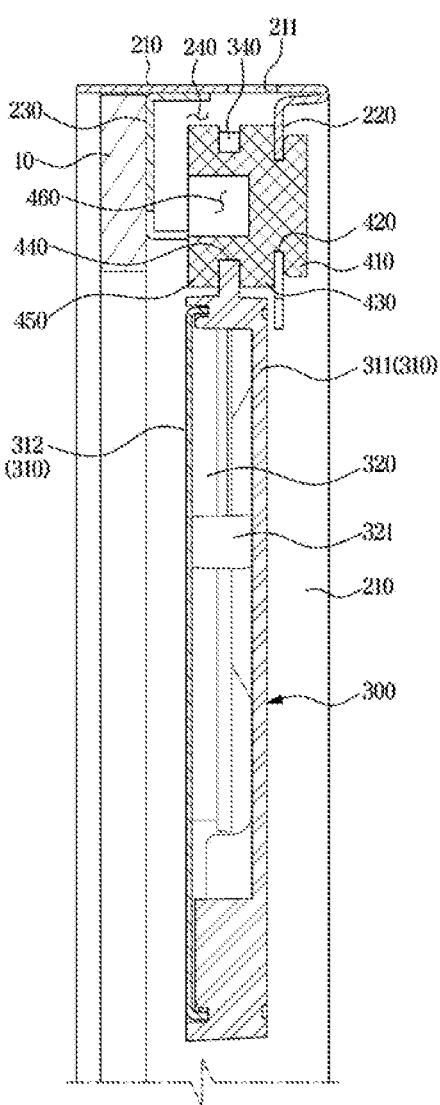
FIG. 13 is a cross-sectional view taken along line BB' in FIG. 12 according to an embodiment of the disclosure.

FIG. 13 is a cross-sectional view taken along line BB' in FIG. 12.

As illustrated in FIG. 13, the speaker module 300 may be coupled to the front chassis 200 by the module mount 400.

The module mount 400 may be located within the accommodation space 240 of the front chassis 200.

The head portion 410 of the module mount 400 may be in contact with the rear flange 220 of the front chassis 200.

As described above, the module mount 400 may include the separation prevention portion 430 supporting an inner surface of the rear flange 220 within the accommodation space 240 to prevent the module mount 400 from being separated from the sliding groove 222 when the module mount 400 is inserted into the sliding groove 222.

The speaker module 300 may include the insertion groove forming portion 340 forming the insertion groove 341 into which the module mount 400 may be coupled, and the separation prevention portion 430 may extend to one side of the insertion groove forming portion 340. The module mount 400 may further include the insertion groove support portion 450 supporting the other side of the insertion groove forming portion 340 to prevent the module mount 400 from being separated from the insertion groove 341.

In other words, the rear flange 220 forming the sliding groove 222 may be located between the separation prevention portion 430 and the head portion 410. The separation prevention portion 430 and a head portion 410 may be positioned in contact with the rear flange 220 at the front and rear of the rear flange 220, respectively. Through this, the module mount 400 may be prevented from deviating from the sliding groove 222, and forward and rearward movements of the module mount 400 may be restricted.

Additionally, the speaker 320 may be coupled to the module body 310 of the speaker module 300. The module body 310 may, in order to form a space therein, include a first module body 311 coupled to the speaker 320 and a second module body 312 capable of being located in front of the speaker 320.

It has been described above that the speaker module 300 may be accommodated in the accommodation space 240 of the front chassis 200. Hereinafter, it will be described that the speaker module 300 is fixed to the frame 10 by the fixer 500.

Figure 14:
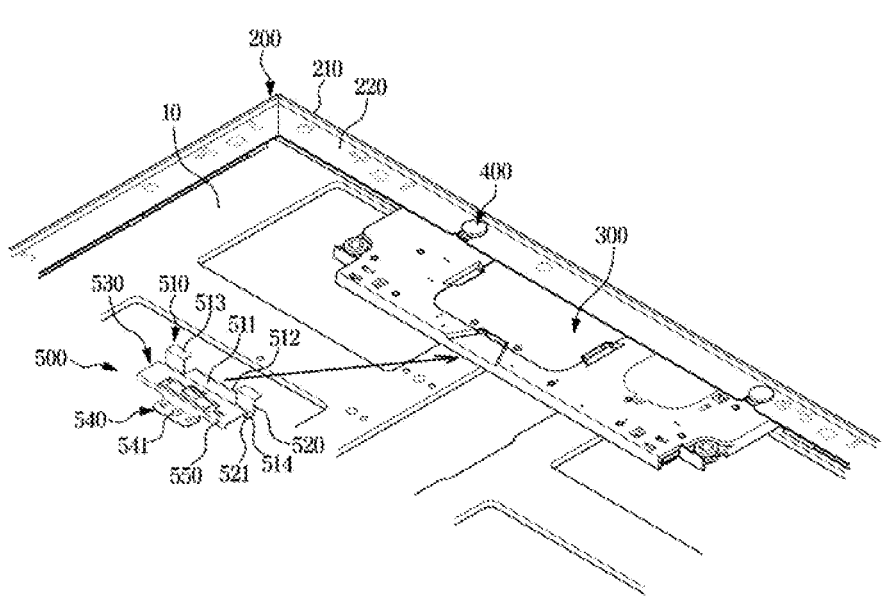
FIG. 14 is a perspective view illustrating a process in which the fixer is coupled to the speaker module in FIG. 11 according to an embodiment of the disclosure.

FIG. 14 is a perspective view illustrating a process in which the fixer 500 is coupled to the speaker module 300 in FIG. 11.

As illustrated in FIG. 14, the frame 10 coupled to the display panel 100 at the rear of the display panel 100 to support the display panel 100, and the fixer 500 coupling the speaker module 300 to the frame 10 to prevent the speaker module 300 from moving forward or rearward may be further provided.

FIG. 14 illustrates before the fixer 500 couples the speaker module 300 and the frame 10.

The fixer 500 may include the support part 510 supporting the speaker module 300 on one side thereof and the coupling part 540 coupled to the frame 10 on the other side. Through this, the speaker module 300 may be coupled to the frame 10. Because the frame 10 is a component with relatively small movement compared to the speaker module 300, when the speaker module 300 is coupled to the frame 10, the movement of the speaker module 300 may be restricted.

The support part 510 provided on the one side of the fixer 500 may include a front support portion 511 supporting the front of the speaker module 300 and a rear support portion 513 supporting the rear of the speaker module 300.

The two rear support portions 513 may be provided on both sides of an upper portion of the fixer 500, respectively, and the one front support portion 511 may be provided in a central portion of a lower portion of the fixer 500. Through this, the speaker 320 may be stably supported by supporting left, right, upper, and lower sides of the speaker 320 based on the fixer 500.

The front support portion 511 may extend in the left-right direction from the fixer body 514. A first support connection portion 520 bent and extending rearward from one side of the fixer body 514 may be provided. The rear support portion 513 may be bent and extend rearward from the first support connection portion 520.

The support part 510 may further include a bent portion 512 bent and extending from an end of the front support portion 511 or the rear support portion 513 in the opposite direction toward the speaker module 300 in order to easily couple the fixer 500 to the speaker module 300. However, FIG. 14 illustrates that the bent portion 512 is formed at the end of the front support portion 511.

As will be described below, the frame 10 may include a guide groove 11 provided adjacent to a position at which the coupling part 540 is coupled, and the coupling part 540 of the fixer 500 may include a guide protrusion 541 protruding to be accommodated in the guide groove 11 at a position corresponding to the guide groove 11 in order to guide the fixer 500 to be coupled to the frame 10.

A second support connection portion 521 bent and extending rearward from the other side of the fixer body 514 may be provided.

Figure 15:
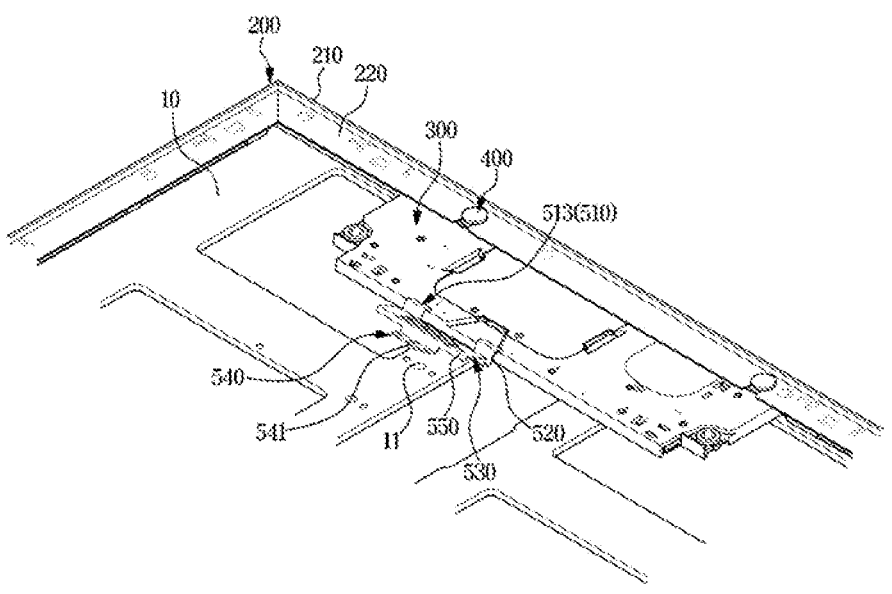
FIG. 15 is a perspective view illustrating that the fixer in FIG. 14 is further coupled to the speaker module according to an embodiment of the disclosure.

The cover coupling part 530 may be positioned between the second support connection portion 521 and the coupling part 540. The cover coupling part 530 may be coupled to the rear cover 30. The cover coupling part 530 may be coupled to the rear cover 30 by an adhesive, but an embodiment, FIG. 15 illustrates that the wire 531 may be provided on the cover coupling part 530, a hook may be provided on the rear cover 30, and the wire 531 may be caught on the hook.

However, this is only one example and embodiments of the present disclosure are not limited thereto.

Because the cover coupling part 530 may be coupled while coming into contact with the rear cover 30, the cover coupling part 530 may protrude rearward from the fixer body 514 to an extent that the cover coupling part 530 may be coupled to the rear cover 30.

In other words, the speaker module 300 and the fixer 500 may be located at the rear of the frame 10, the rear cover 30 may be located at the rear of the speaker module 300 and the fixer 500, and the fixer 500 may further include the cover coupling part 530 capable of being coupled to the rear cover 30.

As described above, the cover coupling part 530 may be coupled to the rear cover 30 by the wire 531. The wire 531 may have the shape of an open curve with one end open. The cover coupling part 530 may include a wire support hole 533 into which the wire 531 may be inserted and supported, and a wire coupling hole 534 provided such that an open portion of the wire 531 may be inserted and accommodated inside the cover coupling part 530. The hook of the rear cover 30 may be coupled to the wire 531, and the wire coupling hole 534 may be provided to facilitate the coupling by corresponding to the coupling position.

The cover coupling part 530 may be located close to the rear cover 30 to facilitate the coupling with the rear cover 30. In this case, because the coupling part 540 of the fixer 500 may be coupled to the frame 10, the coupling part 540 may be located close to the frame. Despite a height difference between the cover coupling part 530 and the coupling part

540, a coupling connection portion 550 may be provided to connect the cover coupling part 530 and the coupling part 540.

FIG. 15 is a perspective view illustrating that the fixer 500 in FIG. 14 is further coupled to the speaker module 300.

As illustrated in FIG. 15, the support part 510 of the fixer 500 may be coupled to support the speaker module 300. Because the speaker module 300 may be located between the front support portion 511 and the rear support portion 513, the first support connection portion 520 connecting the front support portion 511 and the rear support portion 513 may have a length equal to a width of the speaker module 300.

The front support portion 511 or the rear support portion 513 positioned on one side of the fixer 500 may be supported on the speaker module 300, and the guide protrusion 541 of the coupling part 540 positioned on the other side of the fixer 500 may be inserted into the guide groove 11 of the frame 10. By inserting the guide protrusion 541 into the guide groove 11, the fixer 500 may be accurately positioned.

Figure 16:
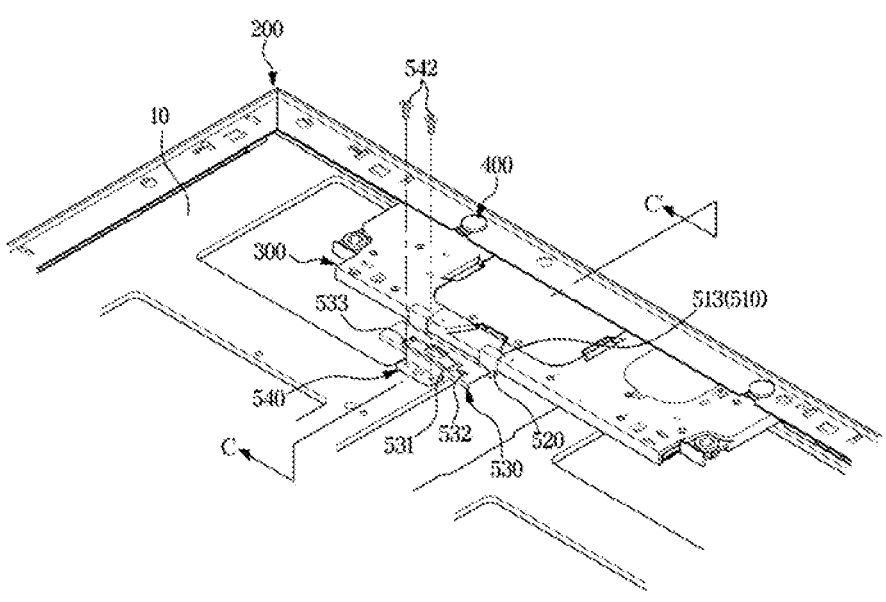
FIG. 16 is a perspective view illustrating that the fixer in FIG. 15 is coupled to the speaker module and seated on the frame according to an embodiment of the disclosure.

FIG. 16 is a perspective view illustrating that the fixer 500 in FIG. 15 is coupled to the speaker module 300 and seated on the frame 10.

As illustrated in FIG. 16, the guide protrusion 541 of the coupling part 540 of the fixer 500 may be inserted into the guide groove 11 of the frame 10.

In this case, the front support portion 511 of the fixer 500 may support the front of the speaker module 300, and the rear support portion 513 of the fixer 500 may support the rear of the speaker module 300.

The coupling part 540 of the fixer 500 and the frame 10 may be coupled by the fastening member 542. The fastening member 542 may be the screw 542, a bolt, or an adhesive. However, the present disclosure is not limited thereto.

Forward and rearward movements of the speaker module 300 may be restricted by the fixer 500. Accordingly, the speaker module 300 may be stably positioned.

The module mounts 400 may be provided on the left and right sides of a center of the speaker module 300, respectively. The respective module mounts 400 may be provided side by side on one side of the speaker module 300. The sliding grooves 222 corresponding to the module mounts 400 may be provided, respectively. Accordingly, the distance between the module emitting hole 330 of the speaker module 300 and the chassis emitting hole 211 of the front chassis 200 may be kept constant.

Figure 17:
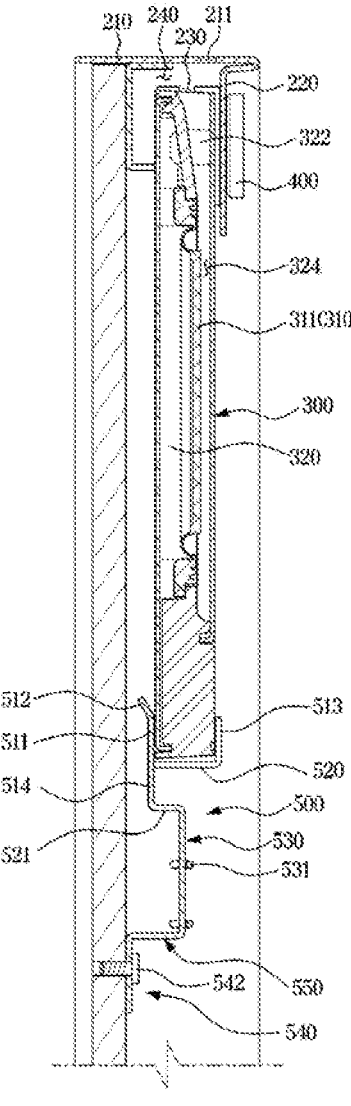
FIG. 17 is a cross-sectional view taken along line CC' in FIG. 16 according to an embodiment of the disclosure.

FIG. 17 is a cross-sectional view taken along line CC' in FIG. 16.

As illustrated in FIG. 17, the speaker module 300 may be seated in the accommodation space 240 of the front chassis 200 to be coupled to the frame 10.

By this coupling, the module emitting hole 330 of the speaker module 300 may be stably positioned adjacent to the chassis emitting hole 211.

In a case in which there is no fixer 500, the forward and rearward movements of the speaker module 300 may not be restricted. In this case, because the speaker module 300 may not be positioned stably, the sound quality may be lowered.

Hereinafter, another embodiment of the display apparatus 1 will be described. In the following description, the same reference numerals are assigned to components that are the same as those of display apparatus 1 described above, and detailed descriptions thereof may be omitted.

Figure 18:
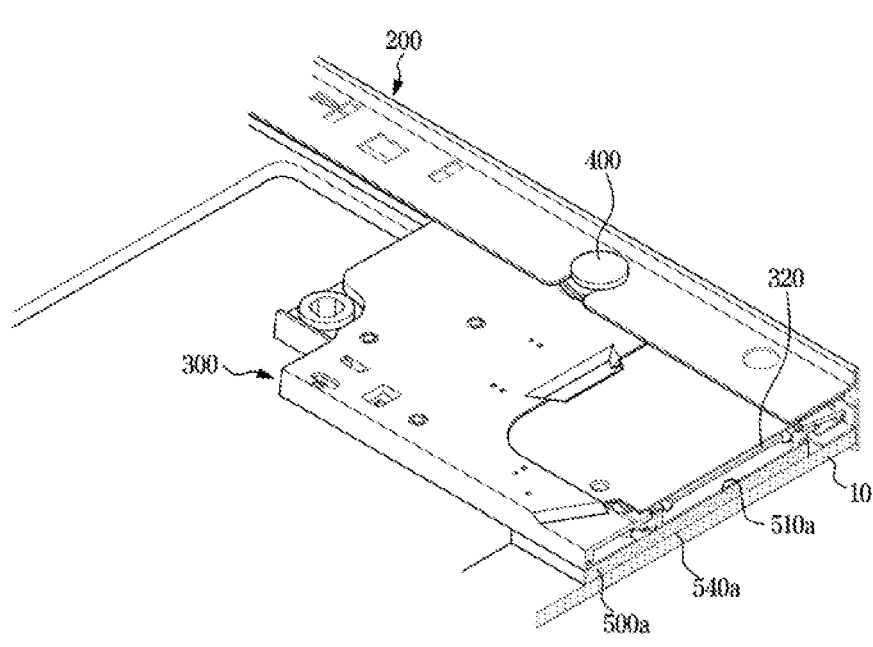
FIG. 18 is a cross-sectional perspective view illustrating the display apparatus cut away according to an embodiment of the present disclosure.

FIG. 18 is a cross-sectional perspective view illustrating the display apparatus 1 cut away according to an embodiment of the present disclosure.

As illustrated in FIG. 18, a fixer 500*a* may be located between the front of the speaker module 300 and the frame 10. In this case, the fixer 500 may have a width equal to a distance between the speaker module 300 and the frame 10. This is because in order to restrict the forward and rearward movements of the speaker module 300 by the fixer 500*a*, an empty space in which the speaker module 300 may move may be prevented from being formed between the speaker module 300 and the frame 10.

The fixer 500*a* located between the speaker module 300 and the frame 10 may be coupled to the speaker module 300 or the frame 10 by an adhesive member such as an adhesive.

Alternatively, the fixer 500*a* may be a magnet. The speaker 320 may include a magnet and a coil to produce sound. As described above, the frame 10 may have the front and rear surfaces made of metal. In a case in which the rear of the frame 10 is made of metal capable of interacting with a magnet, the fixer 500 may be attached to the frame 10 when the fixer 500 is a magnet. Therefore, when the frame 10 is a magnet, the frame 10 may be coupled to the speaker module 300 and the frame 10 without a separate adhesive member. In this case, the speaker module 300 and the frame 10 are coupled by a fixer 500*a*.

Figure 19:
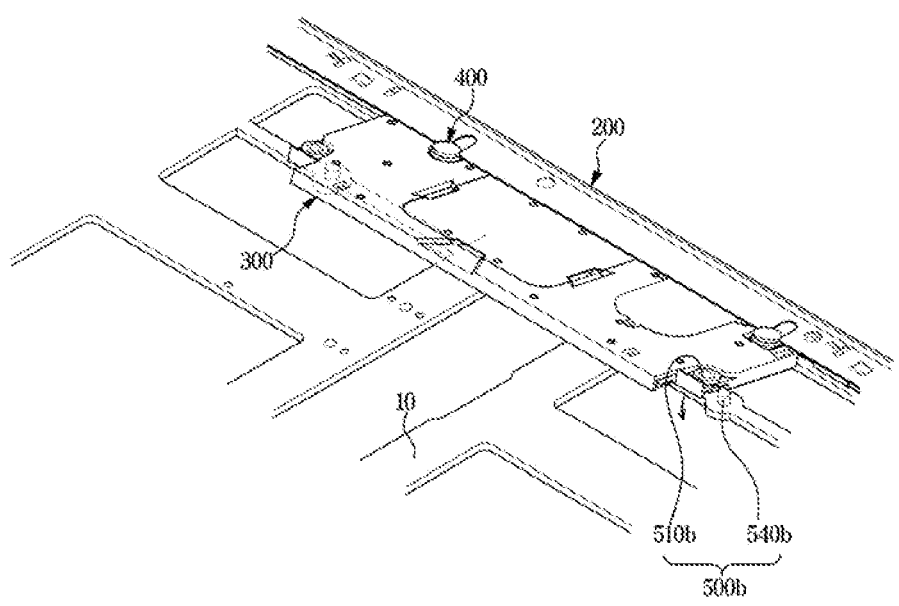
FIG. 19 is a cross-sectional perspective view illustrating the display apparatus according to an embodiment of the present disclosure.

FIG. 19 is a cross-sectional perspective view illustrating the display apparatus 1 according to an embodiment of the present disclosure.

As illustrated in FIG. 19, a fixer 500*b* may have shapes of a fitting hole 510*b* and a fitting protrusion 512*b*. The fitting hole 510*b* may be formed in the speaker module 300. The fitting hole 510*b* may be coupled with the fitting protrusion 512*b* with the forced fitting. In this case, the fitting hole 510*b* may be an elastic member such that the fitting protrusion 512*b* is not easily separated from the fitting hole 510*b*. The fitting protrusion 512*b* may protrude from the frame 10 toward the rear. The fitting protrusion 512*b* may be formed at a position corresponding to the fitting hole 510*b*.

Accordingly, the speaker module 300 may be easily coupled to the frame 10.

Figure 20:
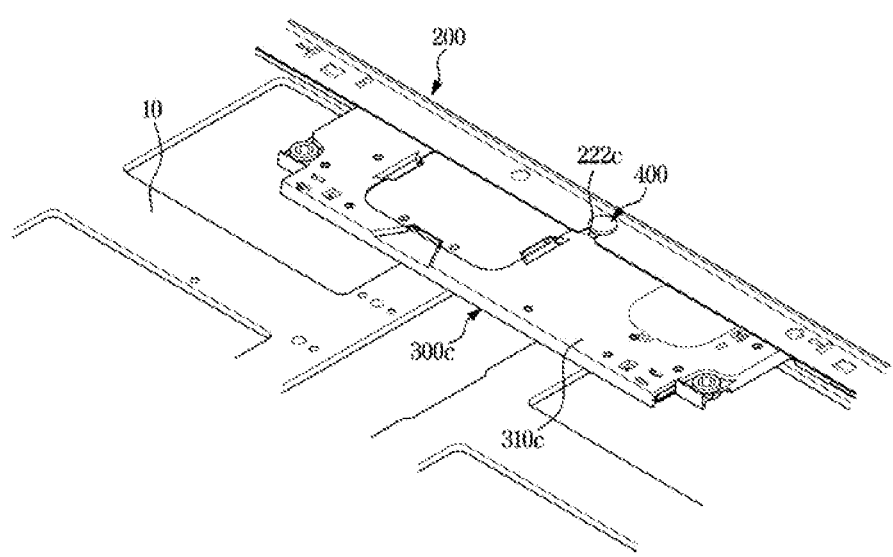
FIG. 20 is a cross-sectional perspective view illustrating the display apparatus according to an embodiment of the present disclosure.

FIG. 20 is a cross-sectional perspective view illustrating the display apparatus 1 according to an embodiment of the present disclosure.

As illustrated in FIG. 20, a single module mount 400*c* may be coupled to the speaker module 300. In this case, because the single module mount 400*c* is provided, the production cost may be lowered and the production time may be shortened.

Thereafter, a configuration for restricting the forward and rearward movements of the speaker module 300 by the fixer 500 is the same as that described above.

Figure 21:
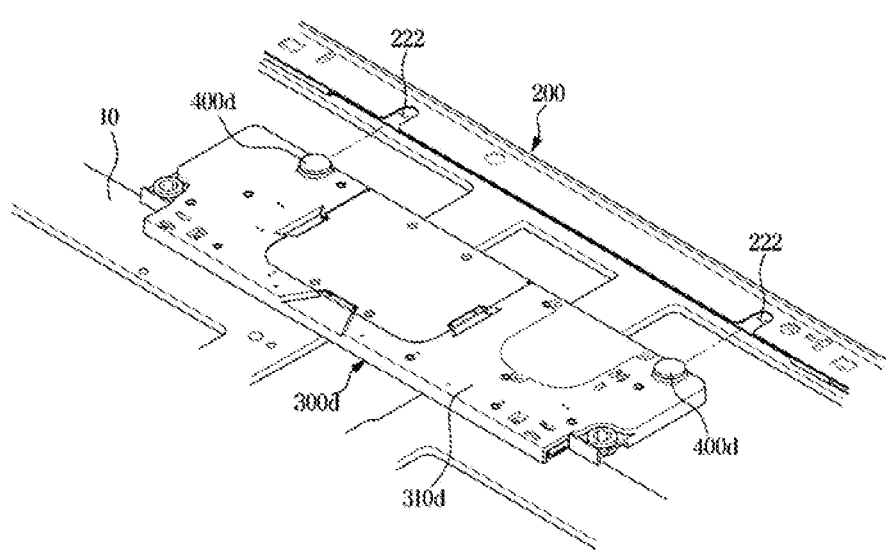
FIG. 21 is a cross-sectional perspective view illustrating the display apparatus according to an embodiment of the present disclosure.

FIG. 21 is a cross-sectional perspective view illustrating the display apparatus 1 according to an embodiment of the present disclosure.

As illustrated in FIG. 21, a module mount 400*d* may be formed integrally with a speaker module 300*d*. In this case, because a process of separately coupling the module mount 400*d* to the speaker module 300*d* is omitted, a display apparatus 1*d* may be produced more quickly.

According to a display apparatus of one or more embodiments of the present disclosure, as a speaker module is coupled while sliding toward an accommodation space of a front chassis, the speaker module is prevented from being separated when accommodated in the accommodation space of the front chassis in order to be located close to a vent hole of the front chassis.

According to the display apparatus of one or more embodiments of the present disclosure, as a module mount coupled to the speaker module is accommodated in the accommodation space of the front chassis while being inserted into a sliding groove formed on the front chassis, the speaker module can be inserted into the accommodation space of the front chassis even without separate avoiding processing on the front chassis.

According to the display apparatus of one or more embodiments of the present disclosure, as a fixer connecting the speaker module and a frame is provided, shaking of the speaker module can be restricted when the speaker module is accommodated in the accommodation space of the front chassis.

Although specific embodiments of the present disclosure have been described and shown, it should be understood by those of skilled in the art that the present disclosure is not limited to the above-described embodiments, and various changes and modifications may be made without departing from the technical idea of the present disclosure described in the following claims.

What is claimed is:

1. A display apparatus comprising:
   a display panel;
   a rear cover covering a rear of the display panel;
   a front chassis on a front side of the rear cover with respect to a first direction and comprising:
      a side exterior part covering a side of the display panel and comprising a chassis emitting hole, and
      a rear flange extending from the side exterior part and forming an accommodation space between the display panel and the side exterior part, the rear flange facing and being coupled to the rear cover with respect to the first direction;
   a speaker module comprising a module emitting hole configured to emit sound to a side edge of the speaker module, wherein at least a portion of the speaker module is in the accommodation space such that the module emitting hole is adjacent to and faces the chassis emitting hole; and
   a module mount configured to be coupled to the front chassis and the speaker module to prevent the speaker module from being separated from the accommodation space.

2. The display apparatus according to claim 1, wherein the speaker module is configured to be inserted into the accommodation space by sliding along an extension direction of the rear flange.

3. The display apparatus according to claim 2, further comprising:
   a frame coupled to the display panel at the rear of the display panel; and
   a fixer configured to couple the speaker module to the frame to prevent forward and backward movements of the speaker module.

4. The display apparatus according to claim 3, wherein the fixer comprises:
   a support part configured to support the speaker module on one side of the fixer; and
   a coupling part coupled to the frame on another side of the fixer.

5. The display apparatus according to claim 4, wherein the frame comprises a guide groove adjacent to the coupling part, and
   wherein the coupling part of the fixer comprises a guide protrusion accommodated in the guide groove at a position corresponding to the guide groove and configured to guide the fixer to be coupled to the frame.

6. The display apparatus according to claim 4, wherein the support part comprises a front support portion configured to support a front surface of the speaker module and a rear support portion configured to support a rear surface of the speaker module.

7. The display apparatus according to claim 1, wherein the front chassis further comprises a mount coupling part configured to be slidably coupled to the module mount.

8. The display apparatus according to claim 7, wherein the mount coupling part comprises a sliding groove extending from an end of the rear flange toward the side exterior part in which the module mount is slidably inserted.

9. The display apparatus according to claim 8, wherein the module mount comprises an elastic member, and wherein the module mount is coupled to the sliding groove with a forced fitting.

10. The display apparatus according to claim 8, wherein the module mount comprises a deformable groove at a central portion of the module mount so that the module mount is deformable when inserted into the sliding groove.

11. The display apparatus according to claim 8, wherein the module mount is formed integrally with the speaker module.

12. The display apparatus according to claim 1, wherein the front chassis further comprises a sliding groove in which the module mount is slidably inserted, and wherein the speaker module further comprises an insertion groove forming portion forming an insertion groove to which the module mount is configured to be coupled.

13. The display apparatus according to claim 1, wherein the rear flange comprises a coupling surface that is facing the rear cover with respect to the first direction and is coupled to the rear cover.

14. A display apparatus comprising:

a display panel;

a rear cover covering a rear of the display panel;

a front chassis comprising:

a side exterior part covering a side of the display panel and comprising a chassis emitting hole, and a rear flange extending from the side exterior part and forming an accommodation space between the display panel and the side exterior part, the rear flange facing and being coupled to the rear cover;

a speaker module comprising a module emitting hole configured to emit sound to a side edge of the speaker module, wherein at least a portion of the speaker module is in the accommodation space such that the module emitting hole is adjacent to and faces the chassis emitting hole; and a module mount configured to be coupled to the front chassis and the speaker module to prevent the speaker module from being separated from the accommodation space, wherein the front chassis further comprises a mount coupling part configured to be slidably coupled to the module mount, wherein the mount coupling part comprises a sliding groove extending from an end of the rear flange toward the side exterior part in which the module mount is slidably inserted, and wherein the module mount comprises a head portion to be supported on an outer surface of the rear flange when the module mount is inserted into the sliding groove.

15. The display apparatus according to claim 14, wherein the module mount further comprises a separation prevention portion configured to support an inner surface of the rear flange within the accommodation space to prevent the module mount from being separated from the sliding groove when the module mount is inserted into the sliding groove.

16. The display apparatus according to claim 15, wherein the speaker module further comprises an insertion groove forming portion forming an insertion groove to which the module mount is configured to be coupled, wherein the separation prevention portion extends to one side of the insertion groove forming portion, and wherein the module mount further comprises an insertion groove support portion configured to support another side of the insertion groove forming portion to prevent the module mount from being separated from the insertion groove.

17. A display apparatus comprising:

a display panel;

a rear cover covering a rear of the display panel;

a front chassis comprising:

a side exterior part covering a side of the display panel and comprising a chassis emitting hole, and a rear flange extending from the side exterior part and forming an accommodation space between the display panel and the side exterior part, the rear flange facing and being coupled to the rear cover;

a speaker module comprising a module emitting hole configured to emit sound to a side edge of the speaker module, wherein at least a portion of the speaker module is in the accommodation space such that the module emitting hole is adjacent to and faces the chassis emitting hole;

a module mount configured to be coupled to the front chassis and the speaker module to prevent the speaker module from being separated from the accommodation space a frame coupled to the display panel at the rear of the display panel; and a fixer configured to couple the speaker module to the frame to prevent forward and backward movements of the speaker module, wherein the speaker module is configured to be inserted into the accommodation space by sliding along an extension direction of the rear flange, wherein the speaker module and the fixer are provided at a rear of the frame, wherein the rear cover is provided at a rear of the speaker module and the fixer, and wherein the fixer further comprises a cover coupling portion configured to be coupled to the rear cover.

* * * * *